US011943933B2

(12) United States Patent
Young et al.

(10) Patent No.: US 11,943,933 B2
(45) Date of Patent: *Mar. 26, 2024

(54) FERROELECTRIC MEMORY DEVICE USING BACK-END-OF-LINE (BEOL) THIN FILM ACCESS TRANSISTORS AND METHODS FOR FORMING THE SAME

(71) Applicant: Taiwan Semiconductor Manufacturing Company Limited, Hsinchu (TW)

(72) Inventors: Bo-Feng Young, Taipei (TW); Mauricio Manfrini, Zhubei (TW); Sai-Hooi Yeong, Zhubei (TW); Han-Jong Chia, Hsinchu (TW); Yu-Ming Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/098,093

(22) Filed: Jan. 17, 2023

(65) Prior Publication Data

US 2023/0157031 A1 May 18, 2023

Related U.S. Application Data

(63) Continuation of application No. 17/230,598, filed on Apr. 14, 2021, now Pat. No. 11,569,250.

(Continued)

(51) Int. Cl.
H10B 53/30 (2023.01)
G11C 11/22 (2006.01)
(Continued)

(52) U.S. Cl.
CPC ............ *H10B 53/30* (2023.02); *G11C 11/221* (2013.01); *G11C 11/2259* (2013.01);
(Continued)

(58) Field of Classification Search
None
See application file for complete search history.

(56) References Cited

U.S. PATENT DOCUMENTS 5,523,964 A    6/1996  McMillan et al.
10,210,921 B1  2/2019  Hwang
(Continued)

FOREIGN PATENT DOCUMENTS

CN    101228619 A    7/2008
CN    107431071 A    12/2017
(Continued)

OTHER PUBLICATIONS

Taiwan Patent Office; Application No. 110121572, Office Action dated Jul. 6, 2022; 9 pages.
(Continued)

*Primary Examiner* — Tan T. Nguyen
(74) *Attorney, Agent, or Firm* — The Marbury Law Group, PLLC

(57) ABSTRACT

A memory device includes metal interconnect structures embedded within dielectric material layers that overlie a top surface of a substrate, a thin film transistor embedded in a first dielectric material layer selected from the dielectric material layers, and is vertically spaced from the top surface of the substrate, and a ferroelectric memory cell embedded within the dielectric material layers. A first node of the ferroelectric memory cell is electrically connected to a node of the thin film transistor through a subset of the metal interconnect structures that is located above, and vertically spaced from, the top surface of the substrate.

20 Claims, 17 Drawing Sheets

Related U.S. Application Data

(60) Provisional application No. 63/045,385, filed on Jun. 29, 2020.

(51) Int. Cl.
  *H01L 21/02* (2006.01)
  *H01L 29/66* (2006.01)
  *H01L 29/786* (2006.01)

(52) U.S. Cl.
  CPC .... *G11C 11/2275* (2013.01); *H01L 21/02565* (2013.01); *H01L 29/66969* (2013.01); *H01L 29/7869* (2013.01)

(56) References Cited

U.S. PATENT DOCUMENTS

| | | | | |
|---|---|---|---|---|
| 11,569,250 | B2* | 1/2023 | Young | H01L 21/02565 |
| 2004/0235245 | A1* | 11/2004 | Summerfelt | H10B 53/30 |
| | | | | 438/257 |
| 2019/0019551 | A1* | 1/2019 | Lee | G11C 13/0069 |
| 2019/0259778 | A1* | 8/2019 | Yoo | H01L 29/516 |
| 2019/0273119 | A1 | 9/2019 | Zhou | |
| 2020/0091156 | A1 | 3/2020 | Sharma et al. | |
| 2020/0105770 | A1* | 4/2020 | Yoo | G11C 11/221 |
| 2020/0105774 | A1 | 4/2020 | Penumatcha et al. | |
| 2020/0176032 | A1* | 6/2020 | Chiang | G11C 13/0007 |

FOREIGN PATENT DOCUMENTS

| | | |
|---|---|---|
| CN | 110291585 A | 9/2019 |
| KR | 20140040009 A | 4/2014 |
| KR | 20190114919 A | 10/2019 |
| TW | 202015207 A | 4/2020 |
| WO | 2019/125497 A1 | 6/2019 |

OTHER PUBLICATIONS

Korean Patent Office; Application No. 10-2021-007397, Office Action dated May 30, 2022; 7 pages.
Korean Patent Office; Application No. 10-2021-007397, Final Rejection Office Action dated Dec. 29 2022; 7 pages.
Chinese Patent and Trademark Office; CN Application No. 202110721679.3, Office Action dated Jul. 31, 2023; 6 pages.
Korean Patent and Trademark Office; Application No. 10-2023-0094543; Office Action dated Jul. 31, 2023; 10 pages.
Korean Patent Office; Application No. 10-2021-007397, 2nd Final Rejection Office Action dated Apr. 21, 2023; 6 pages.

* cited by examiner

FERROELECTRIC MEMORY DEVICE USING BACK-END-OF-LINE (BEOL) THIN FILM ACCESS TRANSISTORS AND METHODS FOR FORMING THE SAME

RELATED APPLICATIONS

This application is a continuation application of U.S. patent application Ser. No. 17/230,598, entitled "Ferroelectric Memory Device Using Back-End-Of-Line (BEOL) Thin Film Access Transistors and Methods of Forming the Same", filed on Apr. 14, 2021 and issued as U.S. Pat. No. 11,569,250 on Jan. 31, 2023, which claims the benefit of priority from U.S. Provisional Application No. 63/045,595, titled "Semiconductor Structure and Method of Forming the Same," filed on Jun. 29, 2020, the entire contents of both are incorporated herein by reference for all purposes.

BACKGROUND

Device density in a semiconductor device is generally limited by the ability to scale dimensions of semiconductor devices. In the semiconductor industry, there is constant desire to increase the areal density of integrated circuits. To do so, individual transistors have become increasingly smaller. However, the rate at which individual transistors may be made smaller is slowing. Moving peripheral transistors from the front-end-of-line (FEOL) to the back-end-of Line (BEOL) of fabrication may be advantageous because functionality may be added at the BEOL while valuable chip area may be made available in the FEOL. Thin film transistors (TFT) made of oxide semiconductors are an attractive option for BEOL integration since TFTs may be processed at low temperatures and thus, will not damage previously fabricated devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
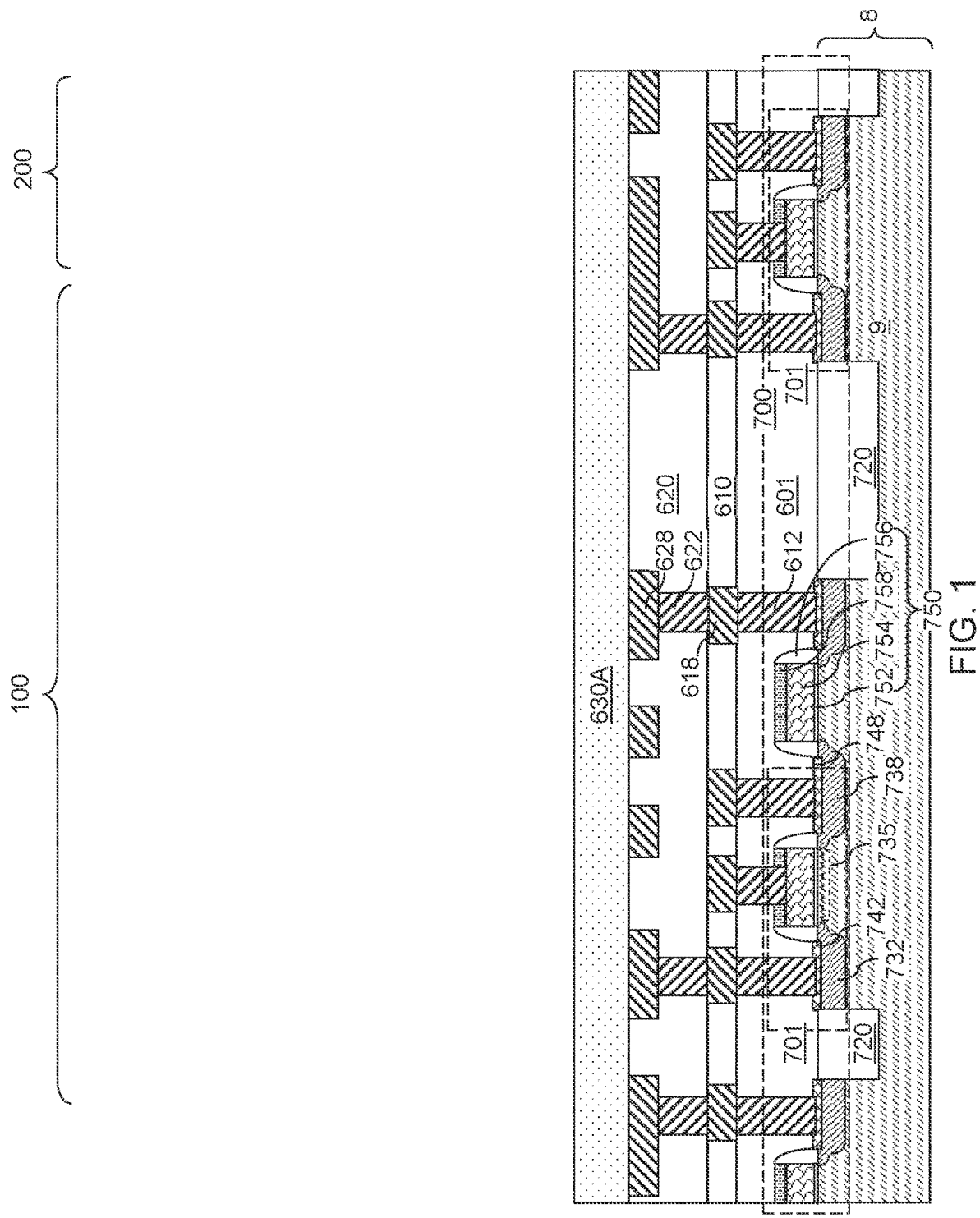
FIG. 1 is a vertical cross-sectional view of an exemplary structure after formation of complementary metal-oxide-semiconductor (CMOS) transistors, first metal interconnect structures formed in lower-level dielectric material layers, and an isolation dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

A ferroelectric material is a material that may have spontaneous nonzero electrical polarization (i.e., non-zero total electrical dipole moment) when the external electrical field is zero. The spontaneous electrical polarization may be reversed by a strong external electric field applied in the opposite direction. The electrical polarization is dependent not only on the external electrical field at the time of measurement, but also on the history of the external electrical field, and thus, has a hysteresis loop. The maximum of the electrical polarization is referred to as saturation polarization. The electrical polarization that remains after an external electrical field that induces saturation polarization is no longer applied (i.e., turned off) is referred to as remnant polarization. The magnitude of the electrical field that needs to be applied in the opposite direction of the remnant polarization in order to achieve zero polarization is referred to as coercive electrical field. For the purposes of forming memory devices, it is generally desirable to have high remnant polarization and high coercive field. High remnant polarization may increase the magnitude of an electrical signal. High coercive field makes the memory devices more stable against perturbations caused by noise-level electrical field and interferences.

Generally, the structures and methods of the present disclosure may be used to form a ferroelectric memory device including at least one ferroelectric memory cell connected to at least one thin film transistor embedded in a back-end-of-line (BEOL) metal interconnect level. A field effect transistor including a single crystalline semiconductor channel may be provided on a semiconductor material layer in a substrate that underlies the at least one ferroelectric memory cell and the at least one thin film transistor. Each ferroelectric memory cell may include a first electrode which is a first node, a ferroelectric dielectric material layer, and a second electrode which is a second node. A thin film transistor may be connected to a node of a ferroelectric memory cell, and a field effect transistor located on the semiconductor material layer may be connected to another node of the ferroelectric memory cell.

Generally, the field effect transistor may provide a larger per-area current density than thin film transistors, and thus, may be used as a programming transistor for the ferroelectric memory cell. Alternatively, a thin film transistor may be used as a programming transistor. A series connection including a field effect transistor, a ferroelectric memory cell, and a thin film transistor may be used to program the ferroelectric memory cell into a first ferroelectric state in which the electrical polarization of the ferroelectric dielectric material layer points toward the first electrode, and to program the ferroelectric memory cell into a second ferroelectric state in which the electrical polarization of the ferroelectric dielectric material layer points toward the second electrode. The asymmetry in the material composition of the first electrode and the second electrode may cause the ferroelectric memory cell to provide different capacitances or different tunneling resistances so that encoding of a data bit in the ferroelectric memory cell is possible.

A two-dimensional array of ferroelectric memory cells and an array of thin film transistors may be provided. Field effect transistors on the semiconductor material layer may be configured to drive a respective row or column of ferroelectric memory cells. Each of the thin film transistor may be configured to access a respective one of the ferroelectric memory cells. Alternatively, thin film transistors may be configured to drive a respective column or row of ferroelectric memory cells. Each field effect transistor on the semiconductor material layer may be configured to access a respective one of the ferroelectric memory cells. As a further alternative, field effect transistors on the semiconductor material layer may be configured to drive a respective row or column of ferroelectric memory cells. Each thin film transistor may be configured to drive a respective column or row of the ferroelectric memory cells. Still alternatively, field effect transistors on the semiconductor material layer may be configured to drive a respective one of ferroelectric memory cells, and each thin film transistor may be configured to drive a respective one of the ferroelectric memory cells. The various aspects of the present disclosure are now described in detail with reference to accompanying drawings.

Referring to FIG. 1, an exemplary structure according to an embodiment of the present disclosure is illustrated. The exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source region 732, a drain region 738, a semiconductor channel 735 that includes a surface portion of the substrate 8 extending between the source region 732 and the drain region 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a memory array region 100 in which an array of ferroelectric memory cells may be subsequently formed. The exemplary structure may further include a peripheral region 200 in which metal wiring for the array of ferroelectric memory devices is provided. Generally, the field effect transistors 701 in the CMOS circuitry 700 may be electrically connected to an electrode of a respective ferroelectric memory cell by a respective set of metal interconnect structures.

Devices (such as field effect transistors 701) in the peripheral region 200 may provide functions that operate the array of ferroelectric memory cells to be subsequently formed. Specifically, devices in the peripheral region may be configured to control the programming operation, the erase operation, and the sensing (read) operation of the array of ferroelectric memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source region 732 or a respective drain region 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

Various metal interconnect structures embedded in dielectric material layers may be subsequently formed over the substrate 8 and the semiconductor devices thereupon (such as field effect transistors 701). In an illustrative example, the dielectric material layers may include, for example, a contact-level dielectric material layer 601, a first metal-line-level dielectric material layer 610, and a second line-and-via-level dielectric material layer 620. The metal interconnect structures may include device contact via structures 612 formed in the contact-level dielectric material layer 601 and contacting a respective component of the CMOS circuitry 700, first metal line structures 618 formed in the first metal-line-level dielectric material layer 610, first metal via structures 622 formed in a lower portion of the second line-and-via-level dielectric material layer 620, and second metal line structures 628 formed in an upper portion of the second line-and-via-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process. While the present disclosure is described using an embodiment in which an array of memory cells formed over the second line-and-via-level dielectric material layer 620, embodiments are expressly contemplated herein in which the array of memory cells may be formed at a different metal interconnect level.

An array of thin film transistors and an array of ferroelectric memory cells may be subsequently deposited over the dielectric material layers (601, 610, 620) that embed the metal interconnect structures (612, 618, 622, 628). The set of all dielectric material layer that are formed prior to formation of an array of thin film transistors or an array of ferroelectric memory cells is collectively referred to as lower-level dielectric material layers (601, 610, 620). The set of all metal interconnect structures that is embedded in the lower-level dielectric material layers (601, 610, 620) is herein referred to as first metal interconnect structures (612, 618, 622, 628). Generally, first metal interconnect structures (612, 618, 622, 628) embedded within at least one lower-level dielectric material layer (601, 610, 620) may be formed over the semiconductor material layer 9 that is located in the substrate 8.

In one embodiment, thin film transistors (TFTs) may be formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as a planar insulating spacer layer 630A. The planar insulating spacer layer 630A includes a dielectric material such as undoped silicate glass, a doped silicate glass, organosilicate glass, or a porous dielectric material, and may be deposited by chemical vapor deposition. The thickness of the planar insulating spacer layer 630A may be in a range from 30 nm to 300 nm, although lesser and greater thicknesses may also be used.

Figure 2:
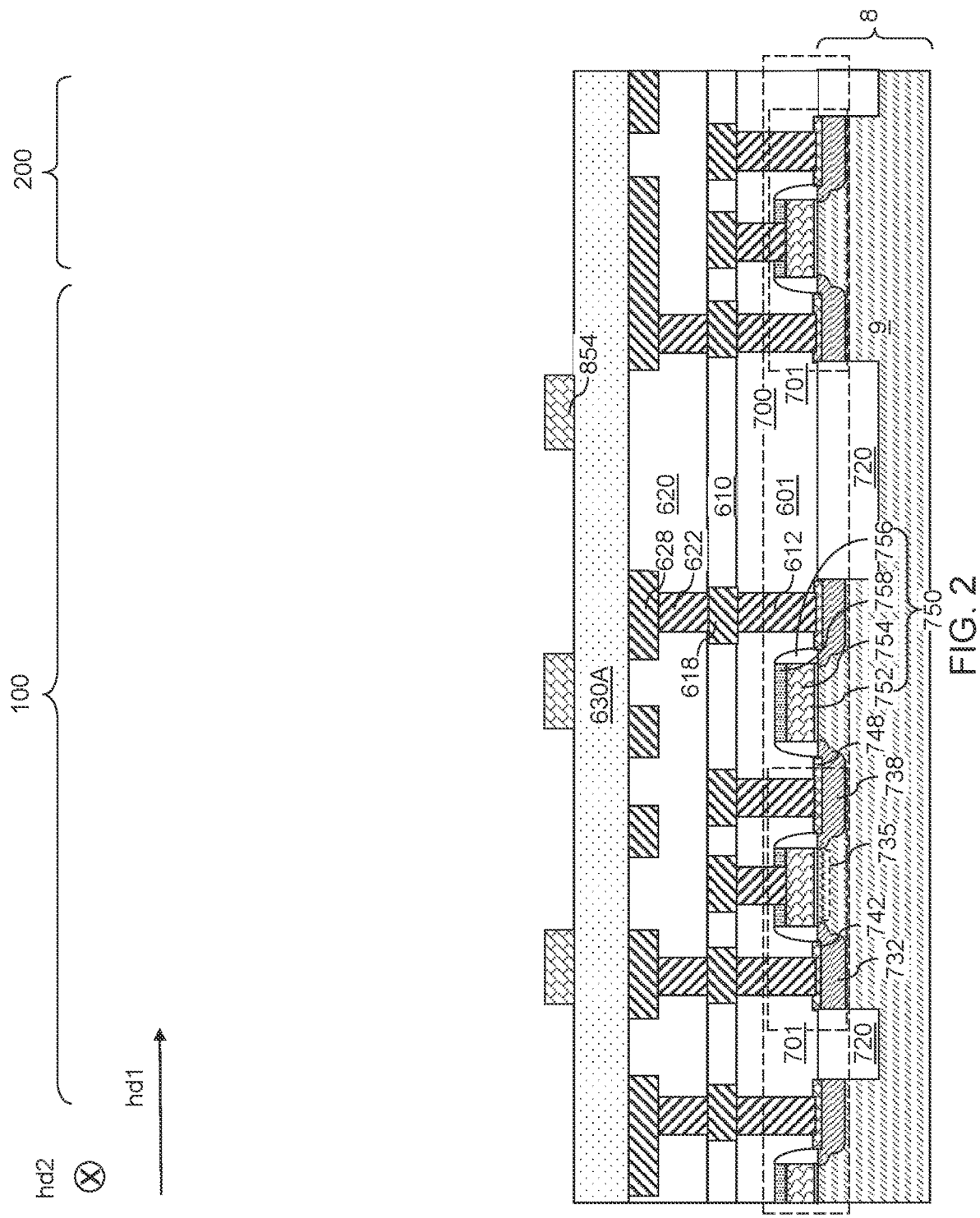
FIG. 2 is a vertical cross-sectional view of the exemplary structure after formation of thin film transistor gate electrodes according to an embodiment of the present disclosure.

Referring to FIG. 2, at least one metallic material may be deposited on the top surface of the planar insulating spacer layer 630A. The deposited metallic material may be lithographically patterned into discrete metallic strips to form at least one thin film transistor (TFT) gate electrode 854, which may be an array of TFT gate electrodes 854. A one-dimensional array or a two-dimensional array of TFT gate electrodes 854 may be formed over the at least one lower-level dielectric material layer (601, 610, 620). In embodiments in which a one-dimensional array of TFT gate electrodes 854 is used, each TFT gate electrode 854 may be used as a common TFT gate electrode 854 for a row of field effect transistors 701.

In one embodiment, the TFT gate electrodes 854 may be laterally spaced apart along a first horizontal direction hd1 (which is referred to as a column direction) and may laterally extend along a second horizontal direction hd2 (which is herein referred to as a row direction) that is perpendicular to the first horizontal direction hd1. The first horizontal direction hd1 is within the plane of the vertical cross-sectional view of FIG. 2, and the second horizontal direction hd2 is perpendicular to the plane of the vertical cross-sectional view of FIG. 2. Each TFT gate electrode 854 may have a uniform width along the first horizontal direction hd1, which is the gate length of a respective thin film transistor to be subsequently formed. For example, the gate length of thin film transistors to be subsequently formed may be in a range from 20 nm to 200 nm, although lesser and greater gate lengths may also be used.

The at least one metallic material of the TFT gate electrodes 854 may include at least one conductive metallic nitride material (such as TiN, TaN, and/or WN), an elemental metal (such as W, Cu, Ru, Co, Mo, Ni, Al, etc.), and/or an intermetallic alloy of at least two elemental metals. The at least one metallic material of the TFT gate electrodes 854 may be deposited by physical vapor deposition, chemical vapor deposition, electroplating, or electroless plating. The thickness of the TFT gate electrodes 854 may be in a range from 10 m, to 50 nm, although lesser and greater thicknesses may also be used. The at least one metallic material may be patterned into the TFT gate electrodes 854, for example, by application and patterning of a photoresist layer over the at least one metallic material, and by transfer of the pattern in the photoresist layer through the at least one metallic material using an etch process such as an anisotropic etch process. The photoresist layer may be subsequently removed, for example, by ashing.

Figure 3:
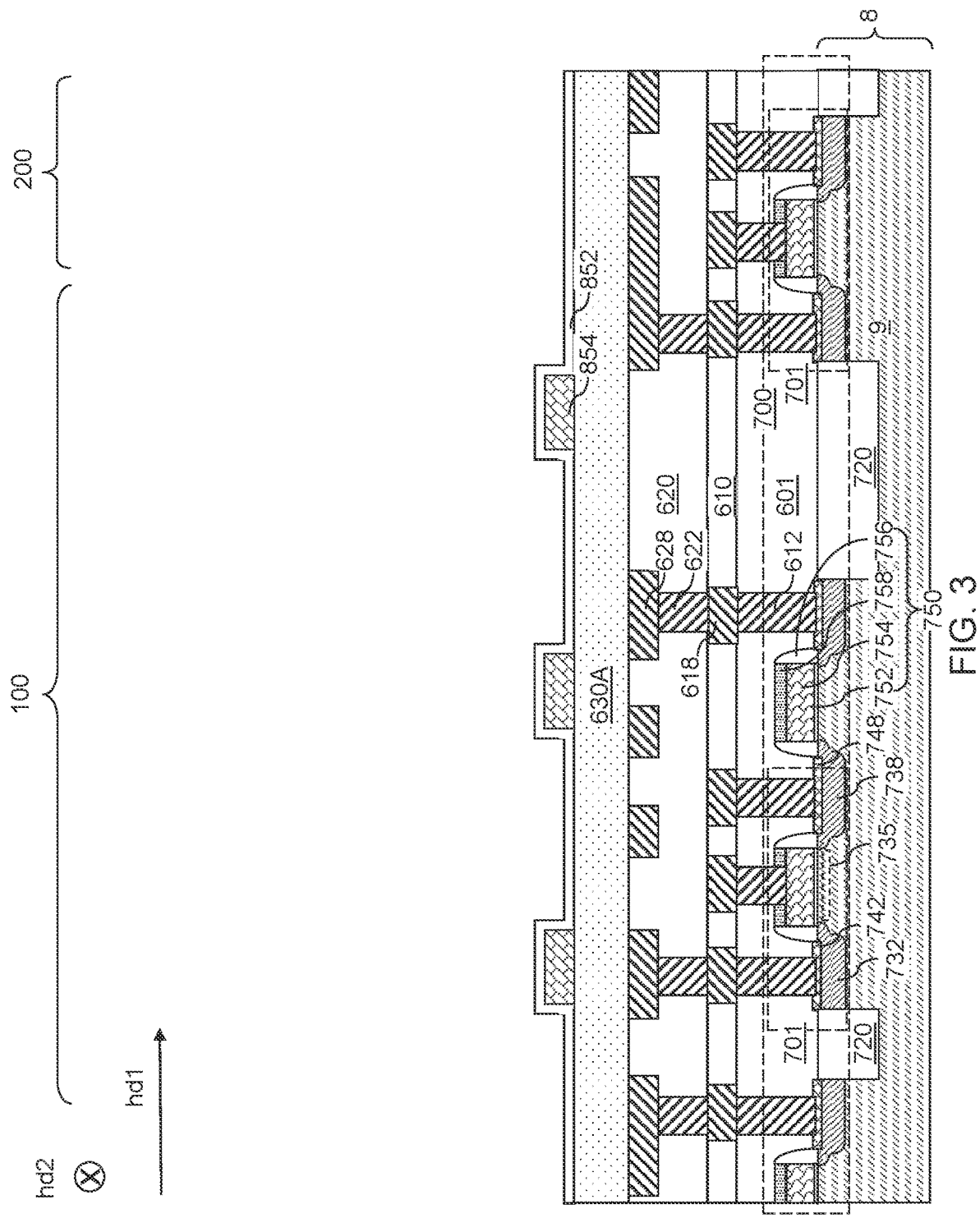
FIG. 3 is a vertical cross-sectional view of the exemplary structure after formation of a thin film transistor gate dielectric layer according to an embodiment of the present disclosure.

Referring to FIG. 3, a thin film transistor (TFT) gate dielectric layer 852 may be formed over the TFT gate electrodes 854 by conformal deposition of a gate dielectric material. The gate dielectric material that may be used for the TFT gate dielectric layer 852 include, but are not limited to, silicon oxide, silicon oxynitride, a dielectric metal oxide (such as aluminum oxide, hafnium oxide, yttrium oxide, lanthanum oxide, etc.), or a stack thereof. Other suitable dielectric materials are within the contemplated scope of disclosure. The TFT gate dielectric layer 852 may be deposited by atomic layer deposition or chemical vapor deposition. The thickness of the TFT gate dielectric layer 852 may be in a range from 1 nm to 12 nm, such as from 2 nm to 6 nm, although lesser and greater thicknesses may also be used.

Figure 4:
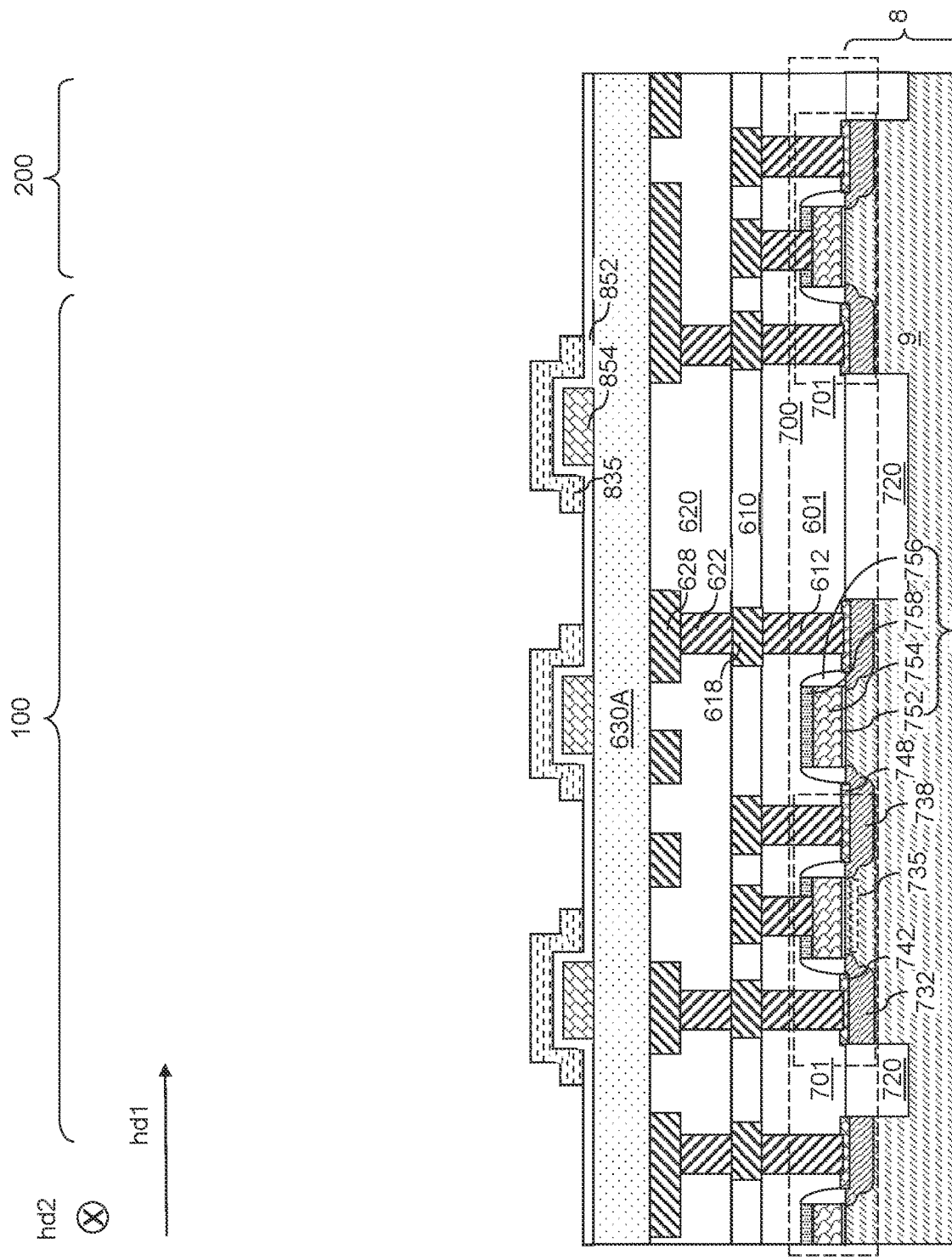
FIG. 4 is a vertical cross-sectional view of the exemplary structure after formation of semiconducting metal oxide layers according to an embodiment of the present disclosure.

Referring to FIG. 4, a semiconducting metal oxide material layer may be deposited over the TFT gate dielectric layer 852. The semiconducting metal oxide material layer may be patterned into at least one semiconducting metal oxide layer 835, such as a two-dimensional array of semiconducting metal oxide layers 835. The semiconducting metal oxide material layer includes a semiconducting metal oxide material, i.e., a metal oxide material that is capable of providing electrical conductivity in a range from 1.0 S/m to $1.0 \times 10^5$ S/m upon suitable doping with electrical dopants (which may be p-type dopants or n-type dopants). In an intrinsic state or under a condition of a low-level electrical doping, a semiconducting metal oxide material may be semiconducting or insulating, and may have electrical conductivity generally in a range from $1.0 \times 10^{-10}$ S/m to $1.0 \times 10^5$ S/m. Exemplary semiconducting metal oxide materials that may be used for the semiconducting metal oxide material layer include, but are not limited to, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. Other suitable semiconducting metal oxide materials are within the contemplated scope of disclosure. In one embodiment, the semiconducting metal oxide material layer may include indium gallium zinc oxide.

The semiconducting metal oxide material layer may include a polycrystalline semiconducting metal oxide material, or an amorphous semiconducting metal oxide material that may be subsequently annealed into a polycrystalline semiconducting metal oxide material having a greater average grain size. The semiconducting metal oxide material layer may be deposited by physical vapor deposition. The thickness of the semiconducting metal oxide material layer may be in a range from 1 nm to 100 nm, such as from 2 nm to 50 nm and/or from 4 nm to 15 nm, although lesser and greater thicknesses may also be used.

A photoresist layer (not shown) may be applied over the semiconducting metal oxide material layer, and may be lithographically patterned into at least one discrete photoresist material portion. In one embodiment, the photoresist layer may be patterned into a two-dimensional array of photoresist material portions such that each patterned photoresist material portion overlies a respective one of the TFT gate electrodes 854. In one embodiment, a row of patterned photoresist material portions that are arranged along the second horizontal direction hd2 may overlie a TFT gate electrode 854 having a strip shape that extends along the second horizontal direction. Unmasked portions of the semiconducting metal oxide material layer may be etched, for example, by an anisotropic etch process using the photoresist material portions of the photoresist layer as an etch mask. Remaining portions of the semiconducting metal oxide material layer comprise at least one semiconducting metal oxide layer 835, which may be a two-dimensional array of semiconducting metal oxide layers 835. The photoresist layer may be subsequently removed, for example, by ashing.

Each semiconducting metal oxide layer 835 may have a rectangular horizontal cross-sectional shape or a rounded rectangular horizontal cross-sectional shape. Each semiconducting metal oxide layer 835 may have a pair of lengthwise edges that laterally extend along the first horizontal direction hd1. Each semiconducting metal oxide layers 835 may also have a pair of widthwise edges that laterally extend along the second horizontal direction hd2. A portion of a TFT gate electrode 854 underlies a middle portion of a semiconducting metal oxide layer 835 such that the TFT gate electrode 854 crosses the two lengthwise edges of the semiconducting metal oxide layer 835 in a plan view.

Optionally, electrical dopants (such as p-type dopants or n-type dopants) may be implanted into portions of the semiconducting metal oxide layers 835 that do not overlie the TFT gate electrodes 854. In this embodiment, a masked ion implantation process may be used.

Figure 5:
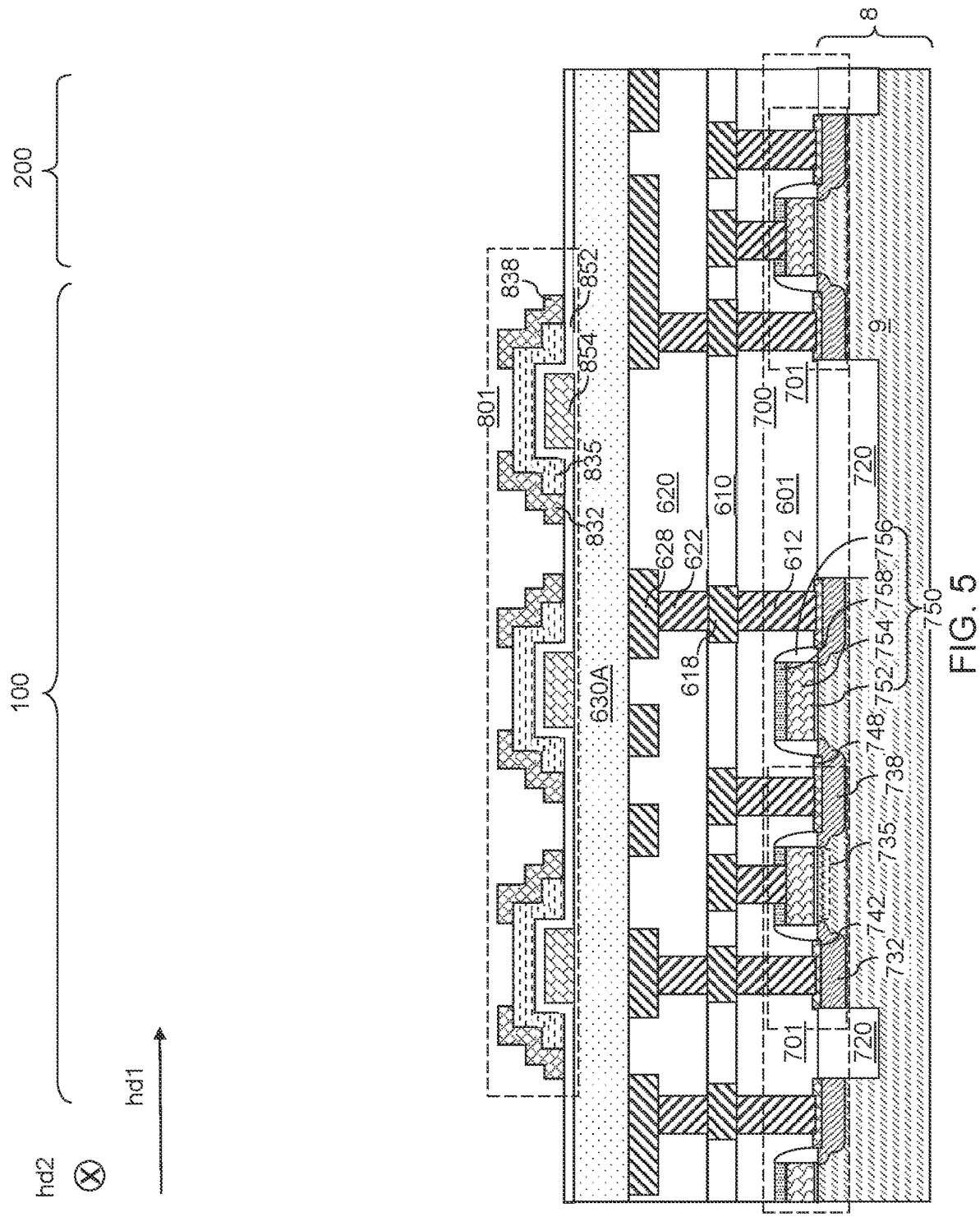
FIG. 5 is a vertical cross-sectional view of the exemplary structure after formation of source contact structures and drain contact structures according to an embodiment of the present disclosure.

Referring to FIG. 5, at least one conductive material may be deposited over the at least one semiconducting metal oxide layer 835 (such as a two-dimensional array of semiconducting metal oxide layers 835). The at least one conductive material may include a conductive metallic nitride material (such as TiN, TaN, and/or WN), an elemental metal (such as W, Ti, Ta, Mo, Ru, Co, Ni, Cu, Al, etc.), and/or an intermetallic alloy. Other suitable conductive materials are within the contemplated scope of disclosure. The at least one conductive material may be deposited by physical vapor deposition, chemical vapor deposition, electroplating, and/or electroless plating. The thickness of the at least one conductive material may be in a range from 5 nm to 100 nm, such as from 10 nm to 50 nm, although lesser and greater thicknesses may also be used.

The at least one conductive material may be patterned into source contact structures 832 and drain contact structures 838. For example, a photoresist layer (not shown) may be applied over the at least one conductive material, and may be lithographically patterned into discrete material portions that cover end portions of each semiconducting metal oxide layer 835. The portions of the semiconducting metal oxide layers 835 that are covered by the photoresist layer may be laterally offset from areas that overlap with the TFT gate electrodes 854 along the first horizontal direction hd1, i.e., the lengthwise direction of each semiconducting metal oxide layer 835. Unmasked portions of the at least one conductive material may be removed, for example, by performing an anisotropic etch process using the photoresist layer as an etch mask. Remaining portions of the at least one conductive material include source contact structures 832 and drain contact structures 838. A pair of a source contact structure 832 and a drain contact structure 838 may be formed on each semiconducting metal oxide layer 835. Each source contact structure 832 may be formed on a source region of a respective semiconducting metal oxide layer 835. Each drain contact structure 838 may be formed on a drain region of a respective semiconducting metal oxide layer 835. A portion of each semiconducting metal oxide layer 835 that overlies a TFT gate electrode 854 and located between a pair of a source region and a drain region constitutes a channel region of a thin film transistor 801.

At least one thin film transistor 801 may be formed over the at least one lower-level dielectric material layer (601, 610, 620). In one embodiment, the semiconducting metal oxide layers 835 may be polycrystalline. Each thin film transistor 801 may comprise a polycrystalline semiconducting metal oxide material as a channel material. In one embodiment, a two-dimensional array of thin film transistors 801 may be formed over the at least one lower-level dielectric material layer (601, 610, 620). In one embodiment, the two-dimensional array of thin film transistors 801 may be formed as a two-dimensional periodic rectangular array in which a set of TFT gate electrodes 854 that laterally extend along the second horizontal direction hd1 are repeated along the first horizontal direction with a first pitch, which is the pitch of the two-dimensional periodic rectangular array along the first horizontal direction hd1. The two-dimensional periodic rectangular array may have a second pitch along the second horizontal direction hd2.

Each TFT 801 may include a respective TFT gate electrode 854, a respective portion of the TFT gate dielectric layer 852 that overlies the TFT gate electrode 854, a respective semiconducting metal oxide layer 835 that overlies the respective TFT gate electrode 854, a respective source contact structure 832 that contacts a top surface of a source region which is a first end portion of the respective semiconducting metal oxide layer 835, and a respective drain contact structure 838 that contacts a top surface of a drain region which is a second end portion of the respective semiconducting metal oxide layer 835.

Figure 6:
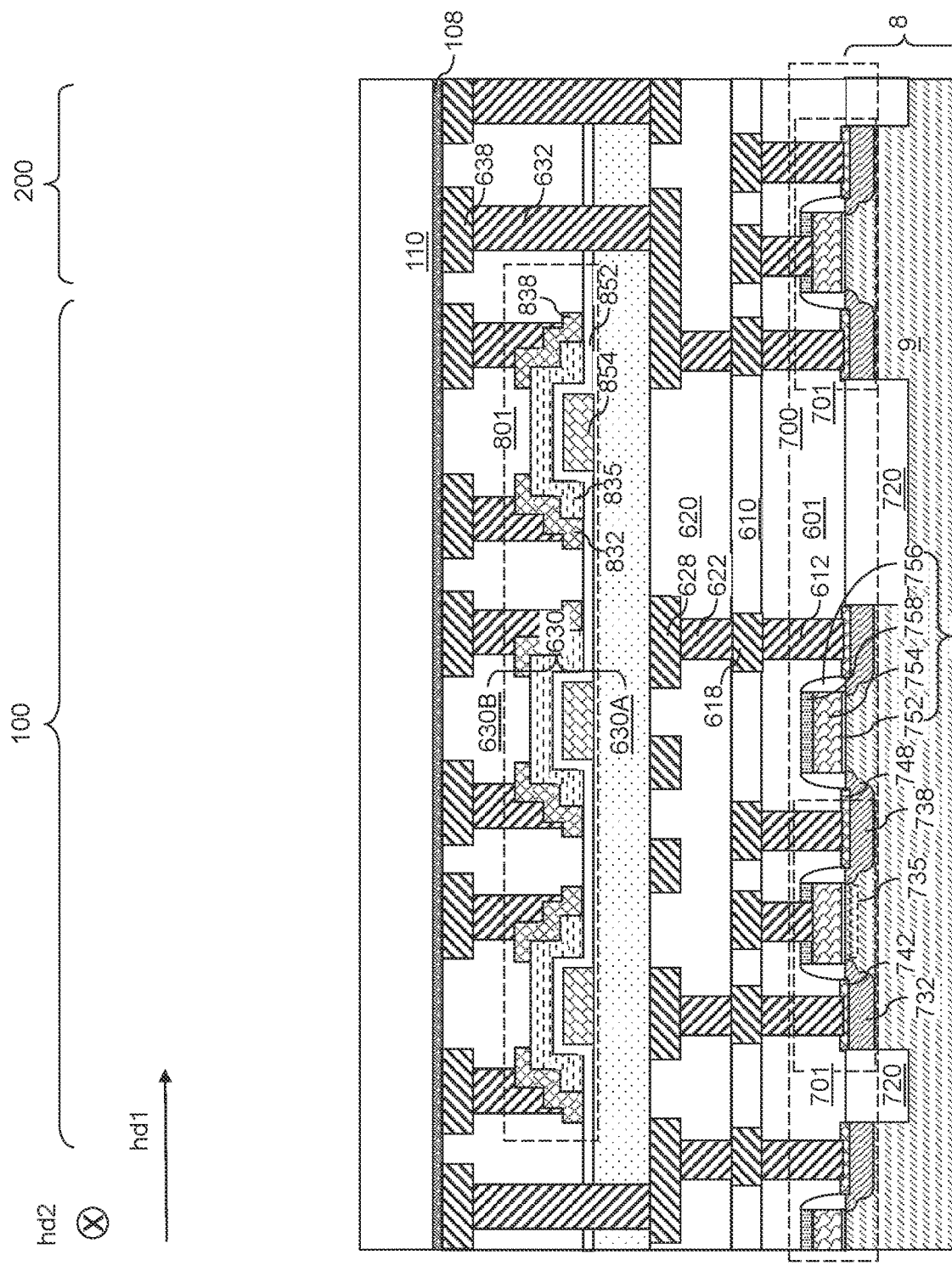
FIG. 6 is a vertical cross-sectional view of the exemplary structure after formation of a TFT-level dielectric material layer, TFT-level metal interconnect structures, a dielectric cap layer, and a connection-via-level dielectric material layer according to an embodiment of the present disclosure.

Referring to FIG. 6, a TFT-level dielectric matrix layer 630B may be deposited over the planar insulating spacer layer 630A and the thin film transistors 801, and may be planarized to provide a flat top surface. The TFT-level dielectric matrix layer 630B may include a self-planarizing dielectric material such as a flowable oxide (FOX) or a planarizable dielectric material such as undoped silicate glass or a doped silicate glass. The planar insulating spacer layer 630A and the TFT-level dielectric matrix layer 630B are collectively referred to as a TFT-level dielectric material layer (630A, 630B). In embodiments in which the TFT-level dielectric material layer (630A, 630B) is formed directly above the level of the second line-and-via-level dielectric material layer 620, the TFT-level dielectric material layer (630A, 630B) may be a third line-and-via-level dielectric material layer 630.

In this embodiment, the thin film transistors 801 may be embedded within the third line-and-via-level dielectric material layer 630. In this embodiment, the third line-and-via-level dielectric material layer 630 may include the planar insulating spacer layer 630A that is formed over the second line-and-via-level dielectric material layer prior to formation of the thin film transistors 801, and a TFT-level dielectric matrix layer 630B that is formed over the thin film transistors 801.

Second metal via structures 632 and third metal line structures 638 may be formed within the third line-and-via-level dielectric material layer 630. For example, a first photoresist layer (not shown) may be applied over the third line-and-via-level dielectric material layer 630, and may be lithographically patterned to form a pattern of line-shaped trenches or pad-shaped trenches. A first anisotropic etch process may be performed to form line trenches and/or pad trenches in an upper portion of the third line-and-via-level dielectric material layer 630. The line trenches and/or the pad trenches may overlie a respective set of at least one node of the thin film transistors 801. The first photoresist layer may be removed, and a second photoresist layer may be applied over the third line-and-via-level dielectric material layer 630. The second photoresist layer may be lithographically patterned to form discrete openings located within the areas of the line trenches and/or pad trenches. A second anisotropic etch process may be performed to form via cavities in areas that underlie the openings in the second photoresist layer. Each of the via cavities may vertically extend to a respective node of the thin film transistors 801. For example, a first subset of the via cavities may vertically extend to a top surface of a respective one of the source contact structures 832. A second subset of the via cavities may vertically extend to a top surface of a respective one of the drain contact structures 838. A third subset of the via cavities may vertically extend to a top surface of a respective one of the TFT gate electrodes 854. The second photoresist layer may be subsequently removed, for example, by ashing. Integrated line and via cavities and optional pad cavities may be formed in the third line-and-via-level dielectric material layer 630. Each integrated line and via cavity may include a line cavity and at least one via cavity. Each pad cavity may include a void configured to form a metal pad therein.

At least one conductive material such as a combination of a conductive metallic nitride liner and a conductive metallic fill material layer may be deposited in each of the cavities in the third line-and-via-level dielectric material layer 630. For example, the conductive metallic nitride liner may include a conductive metallic material such as TiN, TaN, and/or WN. The conductive metallic fill material layer may include a metallic fill material such as W, Ti, Ta, Mo, Ru, Co, Cu, another elemental metal, or an intermetallic alloy. Excess portions of the at least one conductive material may be removed from above the horizontal plane including the top surface of the third line-and-via-level dielectric material layer 630. Remaining portions of the at least one conductive material comprise second metal via structures 632 and third metal line structures 638. Each contiguous combination of a third metal line structure 638 and at least one second metal via structure 632 forms an integrated line and via structure (632, 638).

A subset of the second metal via structures 632 may contact a respective one of the TFT gate electrodes 854, the source contact structures 832, and the drain contact structures 838. The thin film transistors 801 may function as access transistors that control access to a respective single ferroelectric memory cell, a respective row of ferroelectric memory cells to be subsequently formed, or a respective column of ferroelectric memory cells to be subsequently formed.

A dielectric cap layer 108 and a connection-via-level dielectric material layer 110 may be sequentially formed over the metal interconnect structures and the dielectric material layers. For example, the dielectric cap layer 108 may be formed on the top surfaces of the third metal line structures 638 and on the top surface of the third line-and-via-level dielectric material layer 630. The dielectric cap layer 108 includes a dielectric capping material that may protect underlying metal interconnect structures such as the third metal line structures 638. In one embodiment, the dielectric cap layer 108 may include a material that may provide high etch resistance, i.e., a dielectric material and also may function as an etch stop material during a subsequent anisotropic etch process that etches the connection-via-level dielectric material layer 110. For example, the dielectric cap layer 108 may include silicon carbide or silicon nitride, and may have a thickness in a range from 5 nm to 30 nm, although lesser and greater thicknesses may also be used.

The connection-via-level dielectric material layer 110 may include any material that may be used for the dielectric material layers (601, 610, 620, 630). For example, the connection-via-level dielectric material layer 110 may include undoped silicate glass or a doped silicate glass deposited by decomposition of tetraethylorthosilicate (TEOS). The thickness of the connection-via-level dielectric material layer 110 may be in a range from 50 nm to 200 nm, although lesser and greater thicknesses may also be used. The dielectric cap layer 108 and the connection-via-level dielectric material layer 110 may be formed as planar blanket (unpatterned) layers having a respective planar top surface and a respective planar bottom surface that extends throughout the memory array region 100 and the peripheral region 200.

Figure 7:
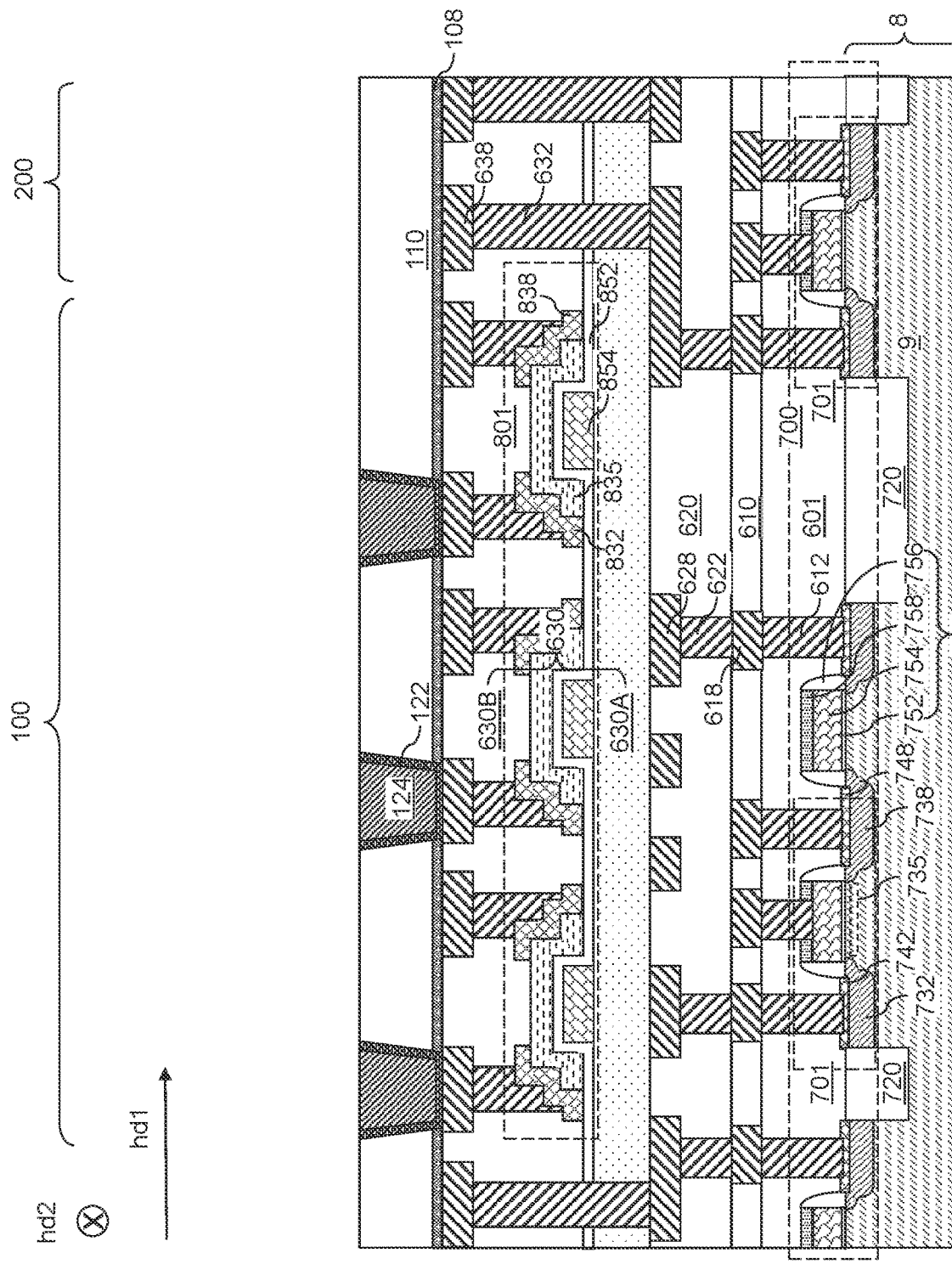
FIG. 7 is a vertical cross-sectional view of the exemplary structure after formation of an array of connection via structures according to an embodiment of the present disclosure.

Referring to FIG. 7, via cavities may be formed through the connection-via-level dielectric material layer 110 and the dielectric cap layer 108. For example, a photoresist layer (not shown) may be applied over the connection-via-level dielectric material layer 110 and may be patterned to form opening within areas of the memory array region 100 that overlie a respective one of the third metal interconnect structures 638. An anisotropic etch may be performed to transfer the pattern in the photoresist layer through the connection-via-level dielectric material layer 110 and the dielectric cap layer 108. The via cavities formed by the anisotropic etch process are herein referred to as lower-electrode-contact via cavities because bottom electrode connection via structures are subsequently formed in the lower-electrode-contact via cavities. The lower-electrode-contact via cavities may have tapered sidewalls having a taper angle (within respective to a vertical direction) in a range from 1 degree to 10 degrees. A top surface of a third metal interconnect structure 638 may be physically exposed at the bottom of each lower-electrode-contact via cavity. The photoresist layer may be subsequently removed, for example, by ashing.

A metallic barrier layer may be formed as a material layer. The metallic barrier layer may cover physically exposed top surfaces of the third metal interconnect structures 638, tapered sidewalls of the lower-electrode-contact via cavities, and the top surface of the connection-via-level dielectric material layer 110 without any hole therethrough. The metallic barrier layer may include a conductive metallic nitride such as TiN, TaN, and/or WN. Other suitable materials within the contemplated scope of disclosure may also be used. The thickness of the metallic barrier layer may be in a range from 3 nm to 20 nm, although lesser and greater thicknesses may also be used.

A metallic fill material such as tungsten or copper may be deposited in remaining volumes of the lower-electrode-contact via cavities. Portions of the metallic fill material and the metallic barrier layer that overlie the horizontal plane including the topmost surface of the connection-via-level dielectric material layer 110 may be removed by a planarization process such as chemical mechanical planarization. Each remaining portion of the metallic fill material located in a respective via cavity comprises a metallic via fill material portion 124. Each remaining portion of the metallic barrier layer in a respective via cavity comprises a metallic barrier layer 122. Each combination of a metallic barrier layer 122 and a metallic via fill material portion 124 that fills a via cavity constitutes a connection via structure (122, 124). An array of connection via structures (122, 124) may be formed in the connection-via-level dielectric material layer 110 on underlying metal interconnect structures.

Figure 8:
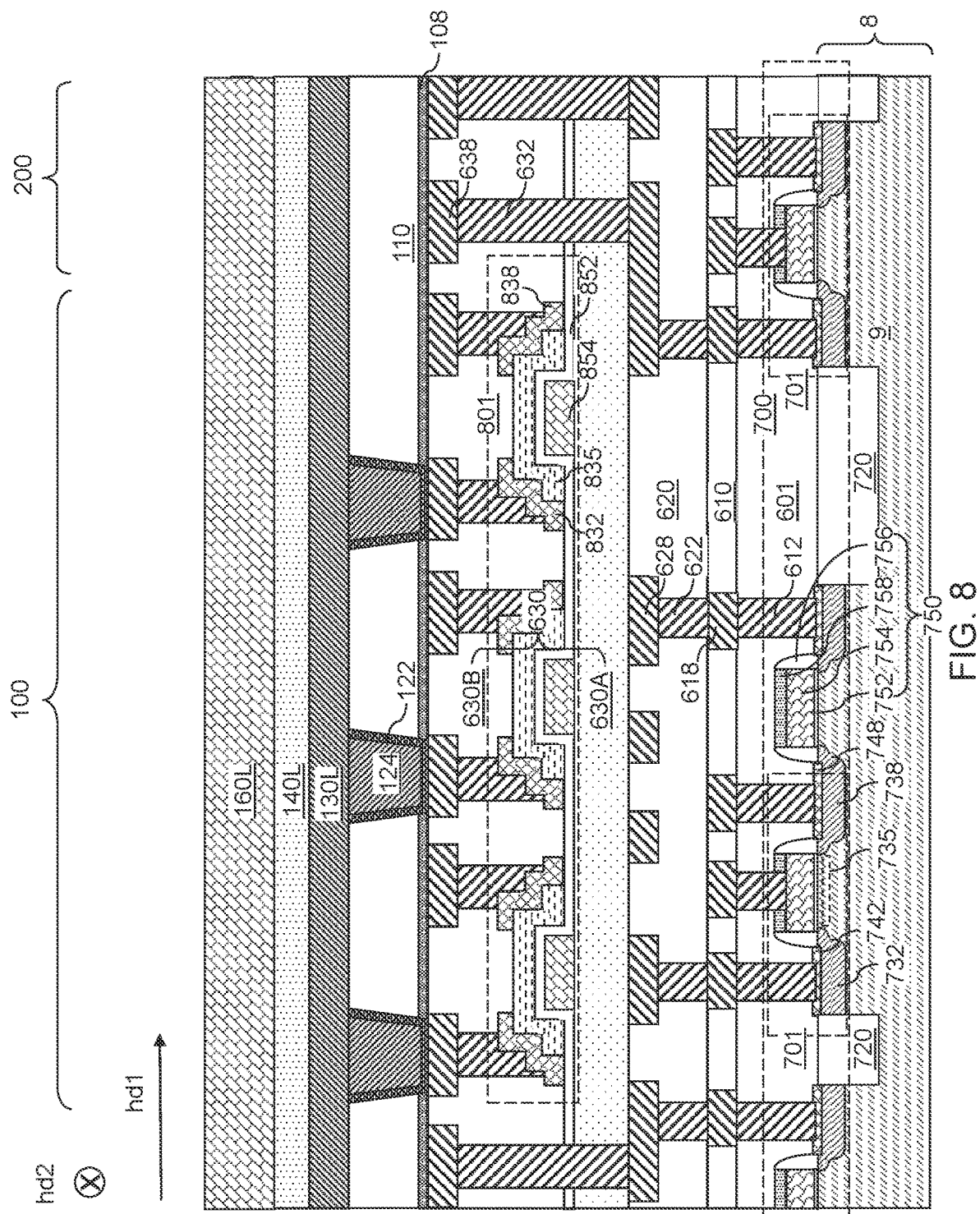
FIG. 8 is a vertical cross-sectional view of the exemplary structure after formation of a first electrode material layer, a ferroelectric dielectric material layer, and a second electrode material layer according to an embodiment of the present disclosure.

Referring to FIG. 8, a layer stack including a first electrode material layer 130L, a ferroelectric dielectric material layer 140L, and a second electrode material layer 160L may be sequentially deposited over the third line-and-via-level dielectric material layer 630. The layers within the layer stack may be deposited by a respective chemical vapor deposition process or a respective physical vapor deposition process. Each layer within the layer stack may be deposited as planar blanket material layers having a respective uniform thickness throughout.

The first electrode material layer 130L may include, and/or may consist essentially of, at least one of a transition metal, a conductive metallic nitride, and a conductive metallic carbide. In one embodiment, the first electrode material layer 130L includes at least one metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the first electrode material layer 130L may include, and/or may consist essentially of, an elemental metal such as W, Cu, Ti, Ta, Ru, Co, Mo, or Pt. The thickness of the first electrode material layer 130L may be in a range from 10 nm to 100 nm, although lesser and greater thicknesses may also be used.

The ferroelectric dielectric material layer 140L includes a ferroelectric material having two stable directions for electrical polarization. The two stable directions may be the upward direction and the downward direction. The ferroelectric material of the ferroelectric dielectric material layer 140L may include at least one material selected from barium titanate, colemanite, bismuth titanate, europium barium titanate, ferroelectric polymer, germanium telluride, langbeinite, lead smaydium tantalate, lead titanate, lead zirconate titanate, lithium niobate, polyvinylidene fluoride, potassium niobate, potassium sodium tartrate, potassium titanyl phosphate, sodium bismuth titanate, lithium tantalate, lead lanthanum titanate, lead lanthanum zirconate titanate, ammonium dihydrogen phosphate, and potassium dihydrogen phosphate. The ferroelectric dielectric material layer 140L may be deposited, for example, by physical vapor deposition. The thickness of the ferroelectric dielectric material layer 140L may be in a range from 2 nm to 20 nm, such as from 4 nm to 10 nm, although lesser and greater thicknesses may also be used.

The second electrode material layer 160L includes a top electrode material, which may include any metallic material that may be used for the first electrode material layer 130L. The second electrode material layer 160L may include, and/or may consist essentially of, at least one of a transition metal, a conductive metallic nitride, and a conductive metallic carbide. Exemplary metallic materials that may be used for the second electrode material layer 160L include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the second electrode material layer 160L may include, and/or may consist essentially of, an elemental metal such as W, Cu, Ti, Ta, Ru, Co, Mo, or Pt. The thickness of the second electrode material layer 160L may be in a range from 10 nm to 100 nm, although lesser and greater thicknesses may also be used.

In an embodiment in which ferroelectric memory cells to be subsequently formed include a respective ferroelectric tunnel junction, a dielectric tunneling barrier layer such as a magnesium oxide layer may be optionally formed between the first electrode material layer 130L and the ferroelectric dielectric material layer 140L, or between the ferroelectric dielectric material layer 140L and the second electrode material layer 160L. In such embodiments, the thickness of the dielectric tunneling barrier layer may be in a range from 0.6 nm to 3.0 nm, although lesser and greater thicknesses may also be used.

Figure 9:
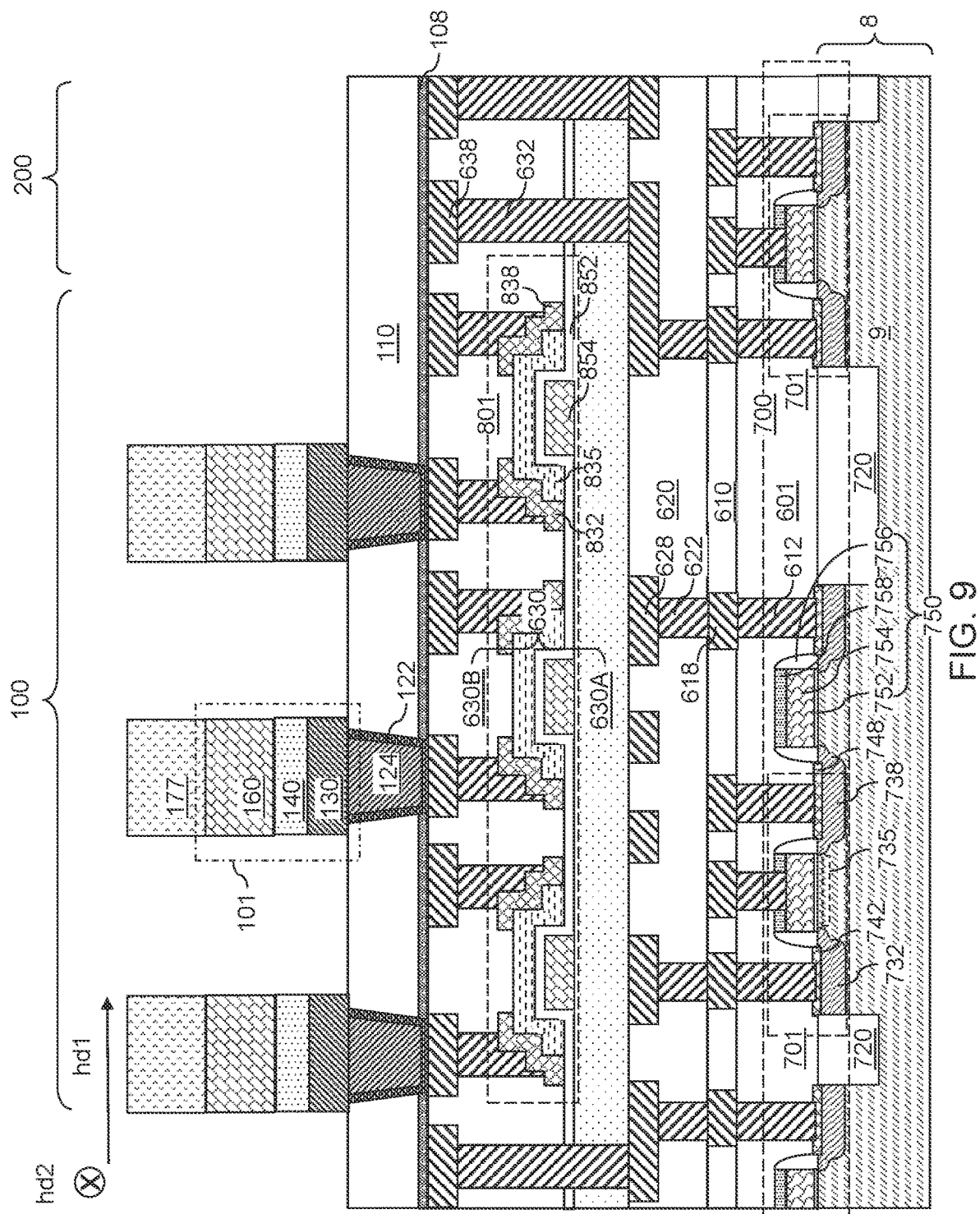
FIG. 9 is a vertical cross-sectional view of the exemplary structure after formation of a two-dimensional array of ferroelectric memory cells according to an embodiment of the present disclosure.

Referring to FIG. 9, at least one patterned etch mask material portion 177 may be formed over the second electrode material layer 160L. For example, the at least one patterned etch mask material portion 177 may include a two-dimensional array of patterned photoresist material portions that are formed by applying and lithographically patterning a photoresist material layer. In one embodiment, the at least one patterned etch mask material portion 177 may include a two-dimensional periodic array (such as a two-dimensional rectangular array) of patterned photoresist material portions. Each patterned photoresist material portion may have a horizontal cross-sectional shape of a circle, a rectangle, a rounded rectangle, an ellipse, or any other closed curvilinear shape. In embodiments in which the at least one patterned etch mask material portion 177 includes a two-dimensional array of at least one patterned etch mask material portions (such as photoresist material portions), the pitch of the at least one patterned etch mask material portion 177 along each horizontal direction of periodicity may be in a range from 20 nm to 400 nm, such as from 40 nm to 200 nm, although lesser and greater pitches may also be used.

An anisotropic etch process may be performed to transfer the pattern in the at least one patterned etch mask material portion 177 through the layer stack (160L, 140L, 130L). The anisotropic etch process etches unmasked portions of the layer stack (160L, 140L, 130L), and forms at least one ferroelectric memory cell 101, which may include a two-dimensional array of ferroelectric memory cells 101.

Each ferroelectric memory cell 101 includes a vertical stack including a first electrode 130, a ferroelectric dielectric material layer 140, and a second electrode 160. Each second electrode 160 is a patterned portion of the second electrode material layer 160L. Each ferroelectric dielectric material layer 140 is a patterned portion of the ferroelectric dielectric material layer 140L. Each first electrode 130 is a patterned portion of the first electrode material layer 130L.

The sidewalls of the layers within each ferroelectric memory cell 101 may be vertically coincident, i.e., may be located within a vertical plane including sidewalls of at least one overlying layer and/or at least one underlying layer. The sidewalls of the layers within each ferroelectric memory cell 101 may be vertical, or may have a taper angle in a range from 0.1 degree to 30 degrees. The at least one patterned etch mask material portion 177 may be subsequently removed, for example, by ashing. Optionally, dielectric spacers (not shown) may be formed around the array of ferroelectric memory cells 101.

An array of ferroelectric memory cells 101 may be formed. Each ferroelectric memory cell 101 may include a first electrode 130, a second electrode 160 overlying the first electrode 130, and a ferroelectric dielectric material layer 140 located between the first electrode 130 and the second electrode 160. In an embodiment in which the ferroelectric memory cells 101 include a respective ferroelectric tunnel junction, a dielectric tunneling barrier layer (not expressly shown) such as a magnesium oxide layer may be located as an interfacial layer between a first electrode 130 and a ferroelectric dielectric material layer 140, or between the ferroelectric dielectric material layer 140 and a second electrode 160.

Figure 10:
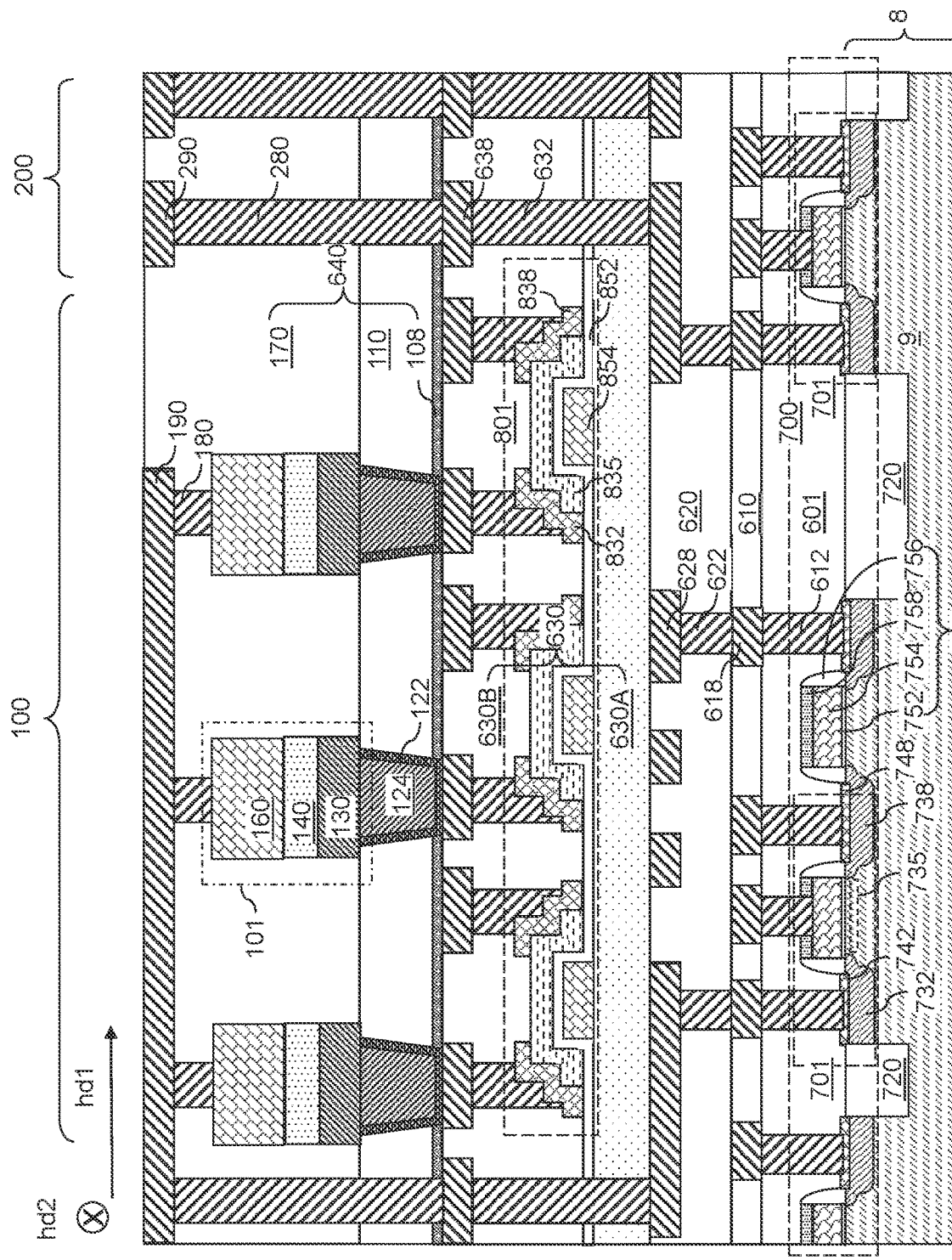
FIG. 10 is a vertical cross-sectional view of the exemplary structure after formation of a memory-level dielectric material layer and memory-level metal interconnect structures according to an embodiment of the present disclosure.

Referring to FIG. 10, a memory-level dielectric material layer 170 may be formed around, and over, the array of ferroelectric memory cells 101 and the connection-via-level dielectric material layer 110. The memory-level dielectric material layer 170 includes a planarizable dielectric material such as undoped silicate glass or a doped silicate glass. The dielectric material of the memory-level dielectric material layer 170 may be deposited by a conformal deposition process (such as a chemical vapor deposition process) or a self-planarizing deposition process (such as spin coating).

At least one lithographic patterning step and at least one anisotropic etch process may be used for form interconnect cavities in the memory-level dielectric material layer 170. For example, a first photoresist layer (not shown) may be applied over the memory-level dielectric material layer 170 and may be lithographically patterned to form discrete openings in the first photoresist layer. A first anisotropic etch process may be performed to form via cavities in the memory-level dielectric material layer 170. After removal of the first photoresist layer, a second photoresist layer (not shown) may be applied over the memory-level dielectric material layer 170 and may be lithographically patterned to form line-shaped openings in the second photoresist layer. A second anisotropic etch process may be performed to form line cavities in the memory-level dielectric material layer 170. The second photoresist layer may be subsequently removed. Interconnect via cavities may be formed through the memory-level dielectric material layer 170. In one embodiment, the interconnect cavities may be formed as integrated line and via cavities. In this embodiment, each integrated line and via cavity may include a line cavity and at least one via cavity. A top surface of a second electrode 160 may be physically exposed at the bottom of each via cavity that is formed in the memory array region 100, and a top surface of a metal line structure (such as a third metal line structure 638) may be physically exposed at the bottom of each via cavity that is formed in the peripheral region 200.

At least one metallic material may be deposited in the interconnect cavities. The at least one metallic material is herein referred to as at least one memory-level metallic material. In one embodiment, a metallic barrier material layer (such as a TiN layer, TaN layer, and/or a WN layer) and a metallic fill material (such as W, Cu, Co, Ru, Mo, or an intermetallic alloy) may be deposited in the interconnect cavities and over the memory-level dielectric material layer 170. Other suitable metallic barrier and fill materials are within the contemplated scope of disclosure.

A planarization process such as a chemical mechanical planarization process may be performed to remove the at least one memory-level metallic material from above the memory-level dielectric material layer 170. The chemical mechanical planarization process may remove material portions from above the horizontal plane including the top surface of the memory-level dielectric material layer 170. Remaining portions of the at least one memory-level metallic material filling the interconnect cavities comprise memory-level metal interconnect structures (180, 190, 280, 290). The memory-level metal interconnect structures (180, 190, 280, 290) may include first memory-level line and via structures (180, 190) formed in the memory array region 100 and second memory-level line and via structures (280, 290) formed in the peripheral region 200.

Each first memory-level line and via structures (180, 190) may include a respective metal via portion 180 that contacts a top surface of a second electrode 160, and a respective metal line portion 190 overlying, and adjoined to, the respective metal via portion 180. Each second memory-level line and via structures (280, 290) may include a respective metal via portion 280 that contacts a top surface of a metal line structure (such as a third metal line structure 638), and a respective metal line portion 290 overlying, and adjoined to, the respective metal via portion 280. Top surfaces of the memory-level metal interconnect structures (180, 190, 280, 290) may be located within the horizontal plane including the top surface of the memory-level dielectric material layer 170.

In embodiments in which the dielectric cap layer 108, the connection-via-level dielectric material layer 110, and the memory-level dielectric material layer 170 are formed above the third line-and-via-level dielectric material layer 630, the combination of the dielectric cap layer 108, the connection-via-level dielectric material layer 110, and the memory-level dielectric material layer 170 constitutes a fourth line-and-via-level dielectric material layer 630.

Generally, the memory-level dielectric material layer 170 embeds, and laterally surrounds, the array of ferroelectric memory cells 101. Metal interconnect structures (such as the first memory-level metal interconnect structures (180, 190)) including a metal via portion may be formed through the memory-level dielectric material layer 170.

The set of all metal interconnect structures that are formed above the first metal interconnect structures (612, 618, 622, 628) is herein collectively referred to as second metal interconnect structures (632, 638, 180, 190, 280, 290). The second metal interconnect structures (632, 638, 180, 190, 280, 290) may be formed over the thin film transistors 801 and the ferroelectric memory cells 101. A subset of the second metal interconnect structures (632, 638, 180, 190, 280, 290) electrically connects a first node of a respective ferroelectric memory cell 101 to a respective node of the thin film transistor 801. Generally, the first node of each ferroelectric memory cell 101 may be the first electrode 130 or the second electrode 160. The node of a thin film transistor 801 that is electrically connected to the first node of a respective ferroelectric memory cell 101 may be a source region that is connected to a source contact structure 832, a drain region that is connected to a drain contact structure 838, or a TFT gate electrode 854. While FIG. 10 illustrates an embodiment in which a source region of each thin film transistor 801 is electrically connected to a first electrode 130 of a respective ferroelectric memory cell 101, embodiments are expressly contemplated herein in which any electrical node of a thin film transistor 801 is electrically connected to a first electrode 130 or a second electrode 160 of a respective ferroelectric memory cell 101 through a respective subset of the second metal interconnect structures (632, 638, 180, 190, 280, 290).

In one embodiment, field effect transistors 701 including a respective semiconductor channel 735 that contains a portion of the semiconductor material layer 9 in the substrate 8 may be formed as described above. In one embodiment, a second node of each ferroelectric memory cell 101 may be electrically connected to a node of a respective field effect transistor 701 through a respective subset of the first metal interconnect structures (612, 618, 622, 628) and a respective subset of the second metal interconnect structures (632, 638, 180, 190, 280, 290). For example, if the first node of a ferroelectric memory cell 101 is a first electrode 130, the second node of the ferroelectric memory cell 101 is a second electrode 160, and vice versa. While the various embodiments herein are described using field effect transistors including planar semiconductor channels located within the semiconductor material layer 9, embodiments are expressly contemplated herein in which fin field effect transistors and/or gate-all-around field effect transistors are used in lieu of, or in addition to, the planar field effect transistors.

Generally, the thin film transistors 801 may be embedded in a first dielectric material layer (such as the TFT-level dielectric matrix layer 630B), and the ferroelectric memory cells 101 may be embedded within a second dielectric material layer (such as the memory-level dielectric material layer 170) selected from dielectric material layers that are located above, or below, the first dielectric material layer. In the illustrated example of FIG. 9, the second dielectric material layer comprising the memory-level dielectric material layer 170 is located above the first dielectric material layer comprising the TFT-level dielectric material layer 630B. Each subset of the second metal interconnect structures (632, 638, 180, 190, 280, 290) that provides electrical connection between a pair of a thin film transistor 801 and a ferroelectric memory cell 101 may extend between the first dielectric material layer and the second dielectric material layer.

In one embodiment, at least one, and/or each, of the ferroelectric memory cells 101 may comprise a ferroelectric tunnel junction providing two tunneling resistance values depending on a polarization direction of a ferroelectric material within a respective ferroelectric dielectric material layer 140, and a combination of a thin film transistor 801 and a field effect transistor 701 may be configured to provide electrical current that tunnels through the ferroelectric tunnel junction.

In one embodiment, the ferroelectric memory cell 101 comprises a programmable ferroelectric capacitor providing two different capacitive states having two different capacitance values depending on a polarization direction of a ferroelectric material within a ferroelectric dielectric material layer 140, and a combination of a thin film transistor 801 and a field effect transistor 701 may be configured to provide a charging current for the programmable ferroelectric capacitor.

Generally, each ferroelectric memory cell 101 may comprise a vertical stack of a first electrode 130, a ferroelectric dielectric material layer 140, and a second electrode 160. The ferroelectric memory cell 101 may comprise one of a ferroelectric tunnel junction and a programmable ferroelectric capacitor. Each ferroelectric tunnel junction may provide two tunneling resistance values depending on a polarization direction of a ferroelectric material within the ferroelectric dielectric material layer 140. Each programmable ferroelectric capacitor may provide two different capacitive states having two different capacitance values depending on a polarization direction of a ferroelectric material within the ferroelectric dielectric material layer 140.

In one embodiment, the field effect transistors 701 and the thin film transistors 801 may be configured such that a field effect transistor 701 may access a row of ferroelectric memory cells 101. In one embodiment, a set of field effect transistors 701 may be configured to access a respective row of ferroelectric memory cells 101. The thin film transistors 801 may be configured to access a respective one of the ferroelectric memory cells 101.

In one embodiment, a two-dimensional array of ferroelectric memory cells 101 may be arranged in M rows and N columns. A total of M×N ferroelectric memory cells 101 may be present within the two-dimensional array of ferroelectric memory cells 101. Each row of ferroelectric memory cells 101 may laterally extend along the second horizontal direction hd2, and may be repeated M times along the first horizontal direction hd1. Each column of ferroelectric memory cells 101 may laterally extend along the first horizontal direction hd1, and may be repeated N times along the second horizontal direction hd2. M field effect transistors 701 may be configured to access a respective row of N ferroelectric memory cells 101. An M×N array of thin films transistors 801 that are arranged in M rows and N columns may be provided, and each of the thin film transistors 801 may be electrically connected to a respective one of the ferroelectric memory cells.

Figure 11:
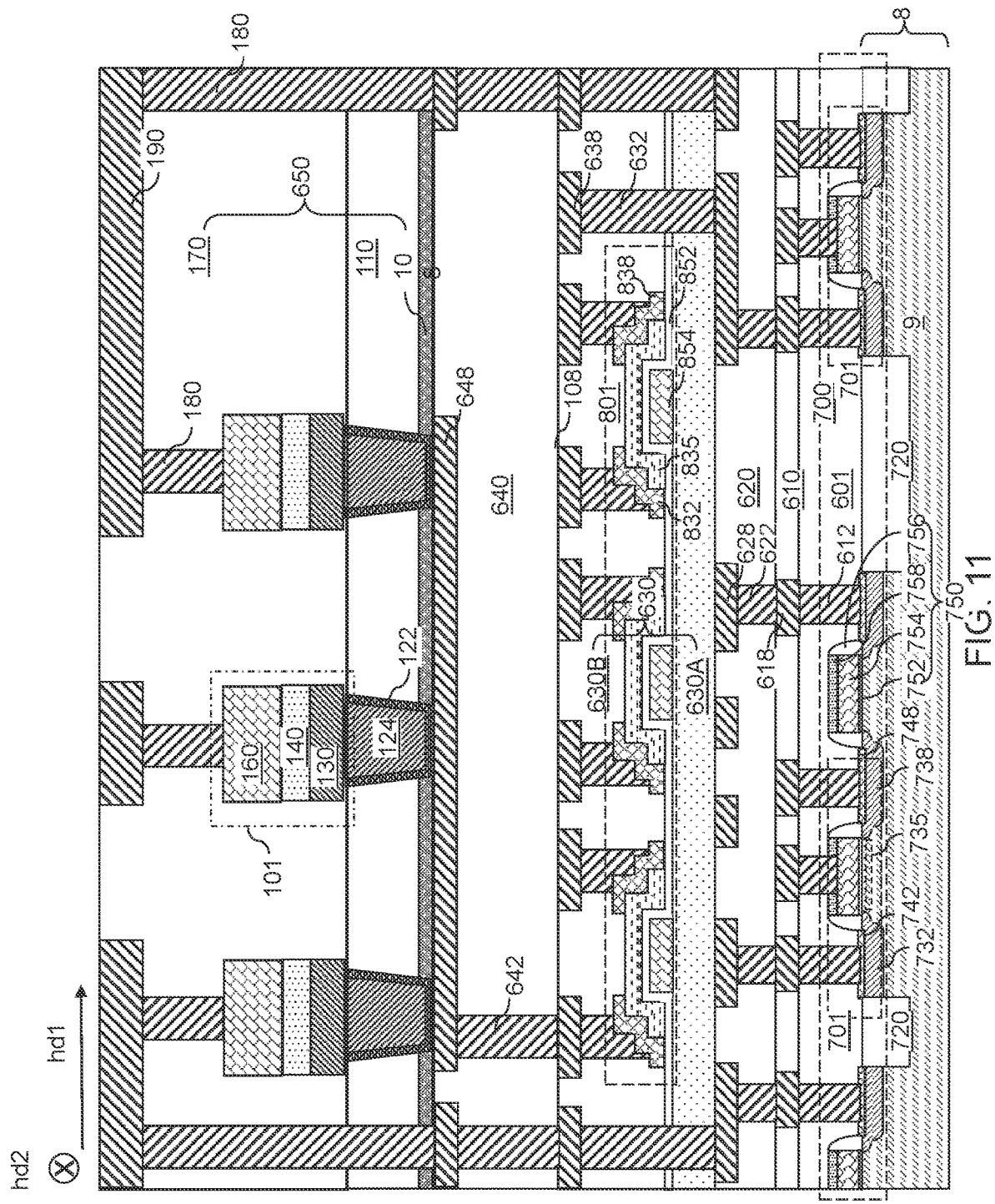
FIG. 11 is a vertical cross-sectional view of a first alternative configuration of the exemplary structure according to an embodiment of the present disclosure.

Referring to FIG. 11, a first alternative configuration of the exemplary structure is illustrated according to an embodiment of the present disclosure. A fourth line-and-via-level dielectric material layer 640 embedding third metal via structures 642 and fourth metal line structures 648 may be formed between the third line-and-via-level dielectric material layer 630 that includes the TFT-level dielectric material layer (630A, 630B) and the interconnect level that includes the ferroelectric memory cells 101. A combination of the dielectric cap layer 108, the connection-via-level dielectric material layer 110, and the memory-level dielectric material layer 170 is formed in the fifth metal interconnect level, and constitutes a fifth line-and-via-level dielectric material layer 650.

In one embodiment, the field effect transistors 701 and the thin film transistors 801 may be configured such that a thin film transistor 801 may access a column of ferroelectric memory cells 101. In one embodiment, a set of thin film transistors 801 may be configured to access a respective column of ferroelectric memory cells 101. The field effect transistors 701 may be configured to access a respective one of the ferroelectric memory cells 101.

In one embodiment, a two-dimensional array of ferroelectric memory cells 101 may be arranged in M rows and N columns. A total of M×N ferroelectric memory cells 101 may be present within the two-dimensional array of ferroelectric memory cells 101. Each row of ferroelectric memory cells 101 may laterally extend along the second horizontal direction hd2, and may be repeated M times along the first horizontal direction hd1. Each column of ferroelectric memory cells 101 may laterally extend along the first horizontal direction hd1, and may be repeated N times along the second horizontal direction hd2. N thin film transistors 801 may be configured to access a respective column of M ferroelectric memory cells 101. An M×N array of field effect transistors 701 that are arranged in M rows and N columns may be provided, and each of the field effect transistors 701 may be electrically connected to a respective one of the ferroelectric memory cells. In one embodiment, the field effect transistors 701 and the thin film transistors 801 may be configured such that each thin film transistor 801 accesses a single ferroelectric memory cell 101 and each field effect transistor 701 accesses a single ferroelectric memory cell 101.

Figure 12:
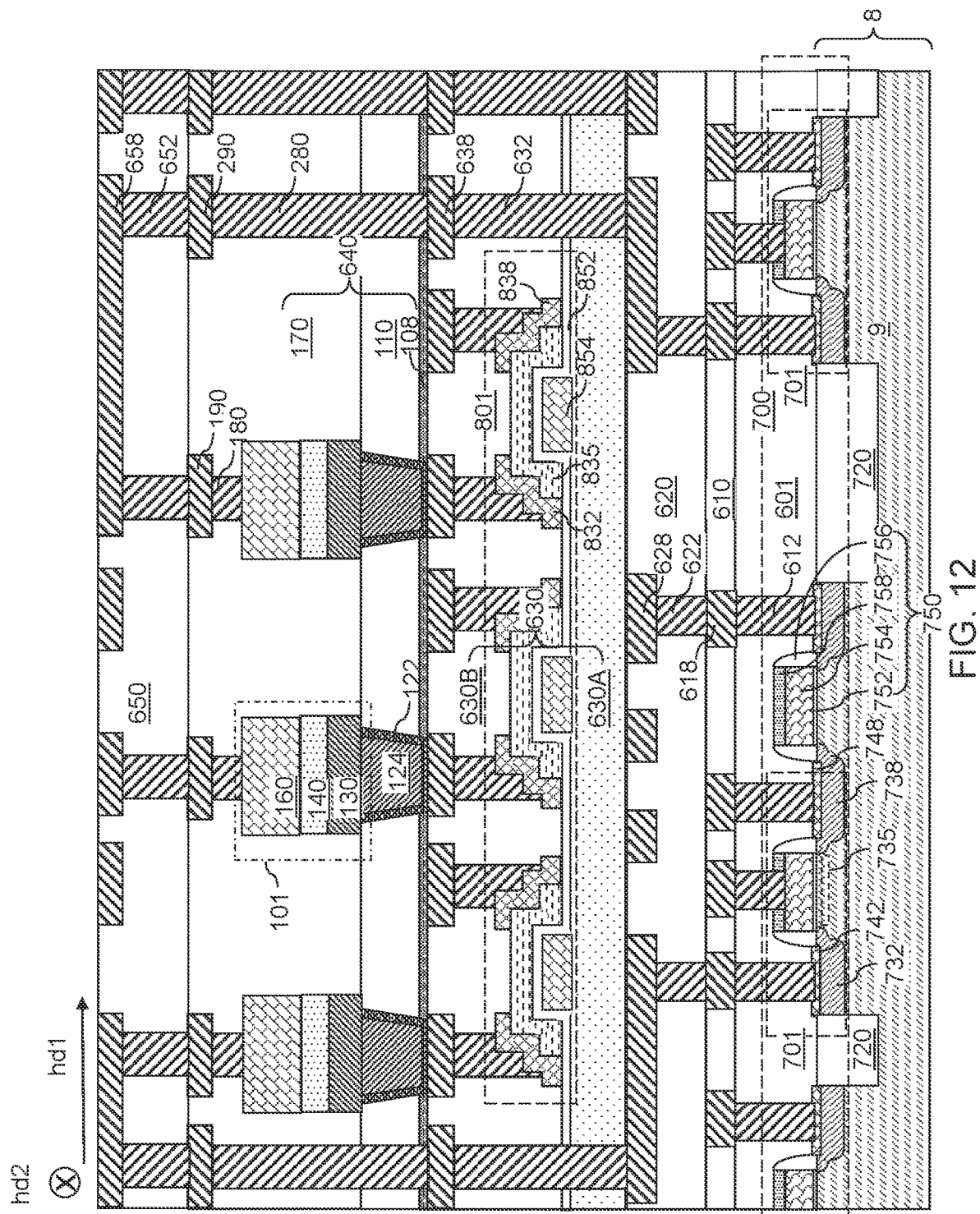
FIG. 12 is a vertical cross-sectional view of a second alternative configuration of the exemplary structure according to an embodiment of the present disclosure.

Referring to FIG. 12, a second alternative configuration of the exemplary structure is illustrated according to an embodiment of the present disclosure is illustrated. A combination of the dielectric cap layer 108, the connection-via-level dielectric material layer 110, and the memory-level dielectric material layer 170 is formed in the fourth metal interconnect level, and constitutes a fourth line-and-via-level dielectric material layer 640. A column of ferroelectric memory cells 101 may be accessed by a thin film transistor 801 in this configuration.

In one embodiment, a two-dimensional array of ferroelectric memory cells 101 may be arranged in M rows and N columns. A total of M×N ferroelectric memory cells 101 may be present within the two-dimensional array of ferroelectric memory cells 101. Each row of ferroelectric memory cells 101 may laterally extend along the second horizontal direction hd2, and may be repeated M times along the first horizontal direction hd1. Each column of ferroelectric memory cells 101 may laterally extend along the first horizontal direction hd1, and may be repeated N times along the second horizontal direction hd2. An M×N array of thin film transistors 801 that are arranged in M rows and N columns may be provided, and each of the thin film transistors 801 may be configured to access a respective one of the M×N ferroelectric memory cells 101. An M×N array of field effect transistors 701 that are arranged in M rows and N columns may be provided, and each of the field effect transistors 701 may be electrically connected to a respective one of the M×N ferroelectric memory cells 101.

In an alternative configuration, a two-dimensional array of ferroelectric memory cells 101 may be arranged in M rows and N columns. A total of M×N ferroelectric memory cells 101 may be present within the two-dimensional array of ferroelectric memory cells 101. M field effect transistors 701 and N thin film transistors 801 may be configured such that each field effect transistor 701 accesses a respective set of N ferroelectric memory cells 101 located within a respective column, and each thin film transistor 801 accesses a respective set of M ferroelectric memory cells 101 located within a row. Thus, a single ferroelectric memory cell 101 may be selected by activating a field effect transistor 701 and a thin film transistor 801.

In another alternative configuration, a two-dimensional array of ferroelectric memory cells 101 may be arranged in M rows and N columns. A total of M×N ferroelectric memory cells 101 may be present within the two-dimensional array of ferroelectric memory cells 101. N field effect transistors 701 and M thin film transistors 801 may be configured such that each field effect transistor 701 accesses a respective set of M ferroelectric memory cells 101 located within a respective column, and each thin film transistor 801 accesses a respective set of N ferroelectric memory cells 101 located within a respective row. Thus, a single ferroelectric memory cell 101 may be selected by activating a field effect transistor 701 and a thin film transistor 801.

Figure 13:
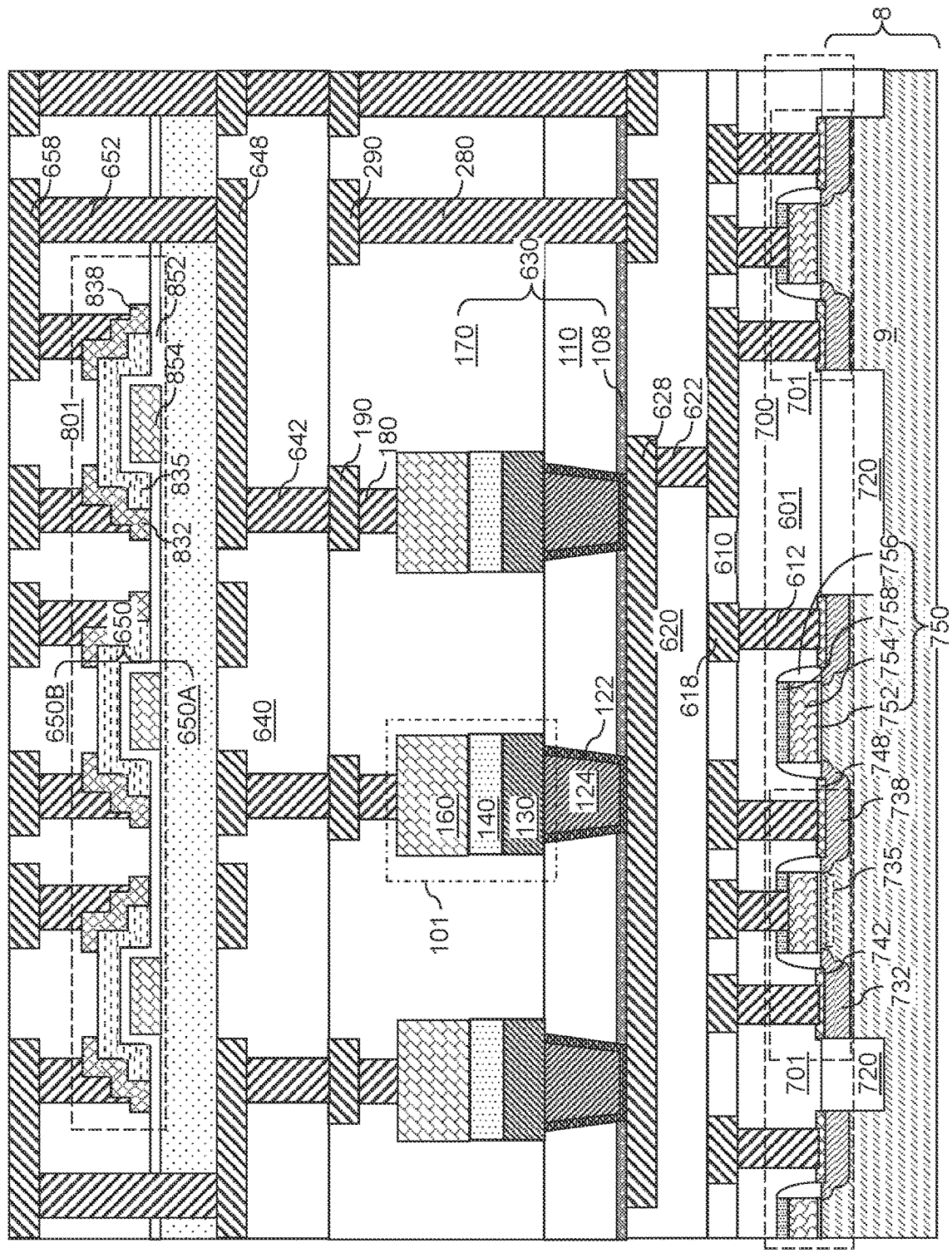
FIG. 13 is a vertical cross-sectional view of a third alternative configuration of the exemplary structure according to an embodiment of the present disclosure.

Referring to FIG. 13, a third alternative configuration of the exemplary structure according to an embodiment of the present disclosure may be derived from any of the configurations illustrated in FIGS. 10-12 by altering the levels in which the array of ferroelectric memory cells 101 and the array of thin film transistors 801 are formed. Specifically, the thin film transistors 801 may be embedded within a first dielectric material layer such as a fifth line-and-via-level dielectric material layer 650. In this embodiment, the fifth line-and-via-level dielectric material layer 650 may include a vertical stack of a planar insulating spacer layer 650A (which provided the same function as a planar insulating spacer layer 630A that is described above) and a TFT-level dielectric matrix layer 650B (which provides the same function as the TFT-level dielectric matrix layer 630B that is described above). Fourth-level metal via structures 652 and fifth-level metal line structures 658 may be used to provide electrical wiring to the thin film transistors 801.

The ferroelectric memory cells 101 may be embedded within a second dielectric material layer selected from dielectric material layers such as third line-and-vie-level dielectric material layer 630. In this embodiment, the third line-and-vie-level dielectric material layer 630 may include the dielectric cap layer 108, the connection-via-level dielectric material layer 110, and the memory-level dielectric material layer 170. The memory-level metal interconnect structures (180, 190, 280, 290) may be used as second metal via structures and third metal line structures that are embedded within the third line-and-via-level dielectric material layer 630. In this embodiment, each of the first dielectric material layer that embeds the thin film transistors 801 and the second dielectric material layer that embeds the ferroelectric memory cells 101 may be located above the at least one lower-level dielectric material layer (601, 610, 620). The second dielectric layer may be located below the first dielectric material layer. Second metal interconnect structures (180, 190, 280, 290, 642, 648, 652, 658) are embedded within the dielectric material layers (630, 640, 650) that overlie the lower-level dielectric material layers (601, 610, 620). Metal interconnect structures that provide electrical connection between the thin film transistors 801 and the ferroelectric memory cells 101 extend between the first dielectric material layer and the second dielectric material layer.

Figure 14:
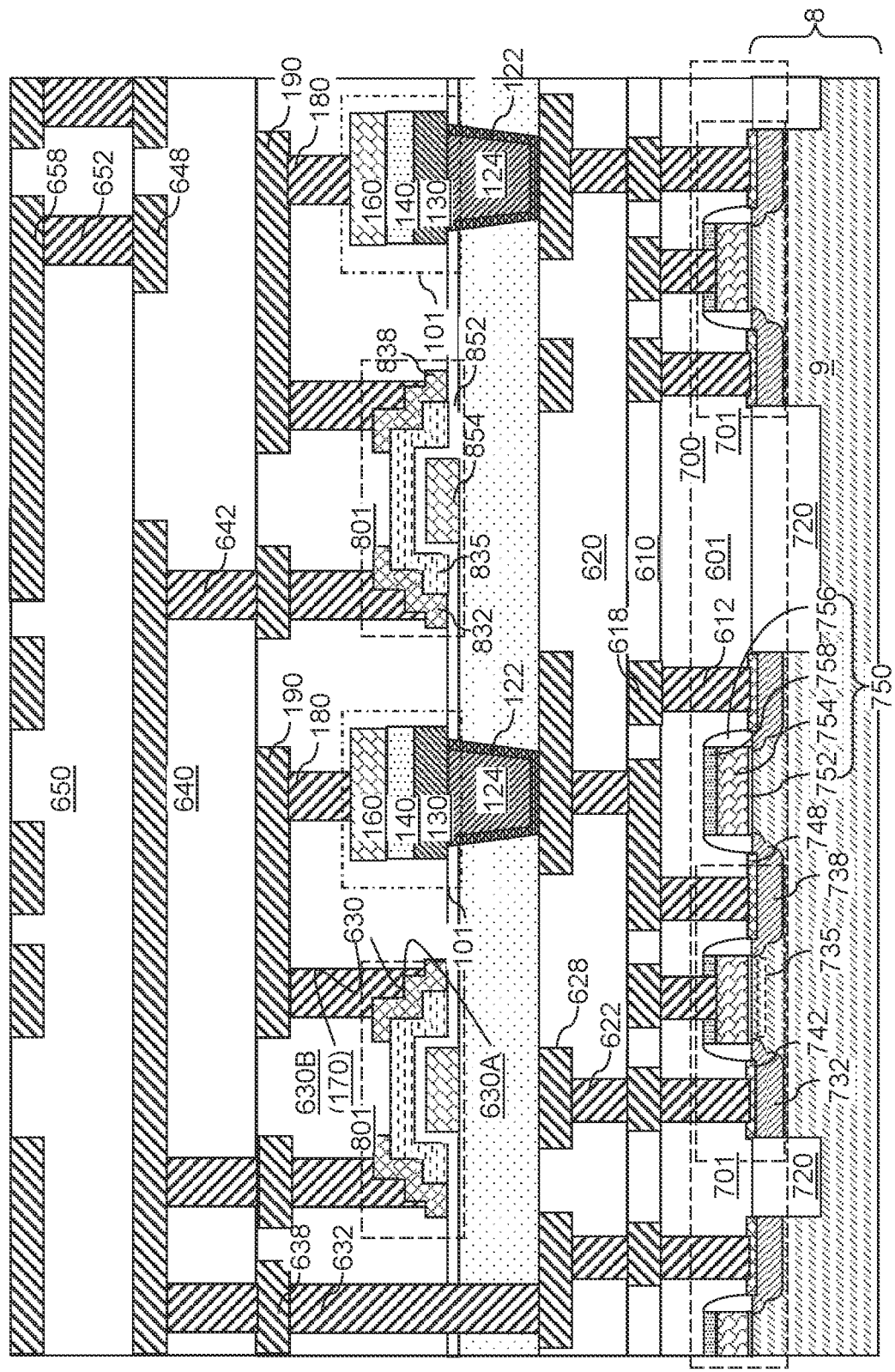
FIG. 14 is a vertical cross-sectional view of a fourth alternative configuration of the exemplary structure according to an embodiment of the present disclosure.

Referring to FIG. 14, a fourth alternative configuration of the exemplary structure according to an embodiment of the present disclosure may be derived from any of the configurations illustrated in FIGS. 10-12 by forming an array of ferroelectric memory cells 101 and the array of thin film transistors 801 at a same level. In the illustrated example, a planar insulating spacer layer 630A may be used in lieu of a combination of a dielectric cap layer 108 and a connection-via-level dielectric material layer 110. In one embodiment, the array of ferroelectric memory cells 101 may be formed prior to formation of the array of thin film transistors 801. In another embodiment, the array of ferroelectric memory cells 101 may be formed after formation of the array of thin film transistors 801.

In one embodiment, the array of ferroelectric memory cells 101 may be interlaced with the array of thin film transistors 801 in order to reduce the lateral distance of electrical wiring between each connected pair of a thin film transistor 801 and a ferroelectric memory cell 101. An array of series connections of a ferroelectric memory cell 101 and a thin film transistor 801 may be provided. In this configuration, a row of a ferroelectric memory cell 101 and a thin film transistor 801 may be accessed by a field effect transistor 701, or a column of a ferroelectric memory cell 101 and a thin film transistor 801 may be accessed by a field effect transistor 701. For example, a M×N array of series connections of a ferroelectric memory cell 101 and a thin film transistor 801 may be provided, and M field effect transistors 701 may access a respective row including N series connections of a ferroelectric memory cell 101 and a thin film transistor 801 located within a same row. Alternatively, N field effect transistors 701 may access a respective row including M series connections of a ferroelectric memory cell 101 and a thin film transistor 801 located within a same column.

In this configuration, the first dielectric material layer that laterally surrounds the array of thin film transistors 801 and the second dielectric material layer that laterally surrounds the array of ferroelectric memory cells 101 may be the same. Thus, the TFT-level dielectric matrix layer 630B may be the memory-level dielectric material layer 170. In one embodiment, each set of metal interconnect structures that provides electrical connection between a ferroelectric memory cell 101 and a thin film transistor 801 may be embedded within the common dielectric material layer (such as the TFT-level dielectric matrix layer 630B), which is the first dielectric material layer and the second dielectric material layer.

Figure 15:
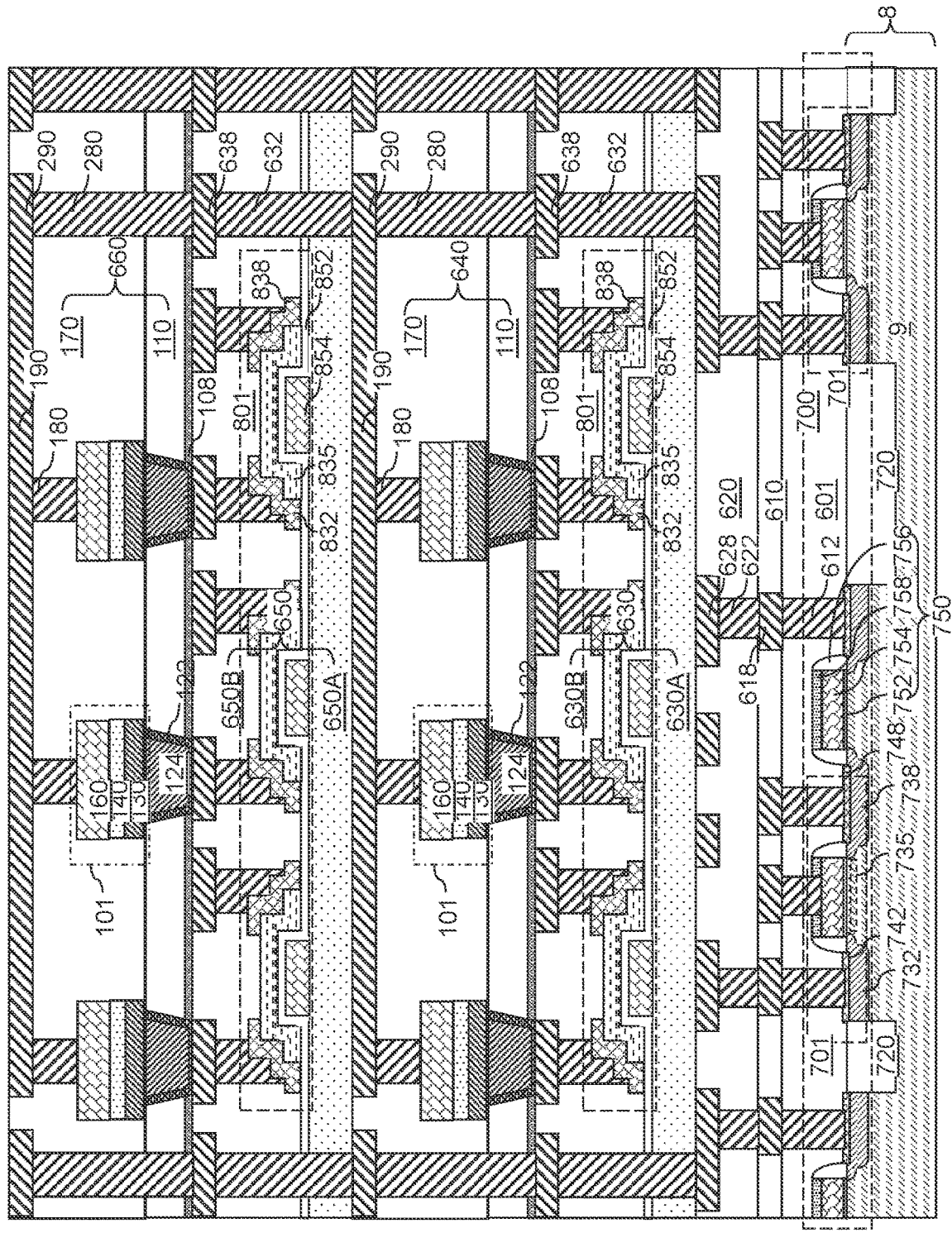
FIG. 15 is a vertical cross-sectional view of a fifth alternative configuration of the exemplary structure according to an embodiment of the present disclosure.

Referring to FIG. 15, a fifth alternative configuration of the exemplary structure according to an embodiment of the present disclosure may be derived from any of the configurations illustrated in FIGS. 10-14 by duplicating a combination of an array of thin film transistors 801 and an array of ferroelectric memory cells 101 along a vertical direction at least once. Multiple combinations of an array of thin film transistors 801 and an array of ferroelectric memory cells 101 may be formed along the vertical direction. In the illustrated example, a combination of a first array of thin film transistors 801 and a first array of ferroelectric memory cells 101 may be formed over the levels of a third line-and-via-level dielectric material layer 630 and a fourth line-and-via-level dielectric material layer 640. A combination of a second array of thin film transistors 801 and a second array of ferroelectric memory cells 101 may be formed over the levels of a fifth line-and-via-level dielectric material layer 650 and a sixth line-and-via-level dielectric material layer 660. Any of the wiring schemes for addressing a selected ferroelectric memory cell 101 may be individually used at each combination of an array of thin film transistors 801 and an array of ferroelectric memory cells 101. In one embodiment, a field effect transistor 701 may address multiple levels of ferroelectric memory cells 101 located at different metal interconnect levels. For example, a field effect transistor 701 may address a row of ferroelectric memory cells 101 located within the combination of a first array of thin film transistors 801 and a second array of ferroelectric memory cells 101 and another row of ferroelectric memory cells located within the combination of a second array of thin film transistors 801 and a second array of ferroelectric memory cells 101 simultaneously.

Figure 16:
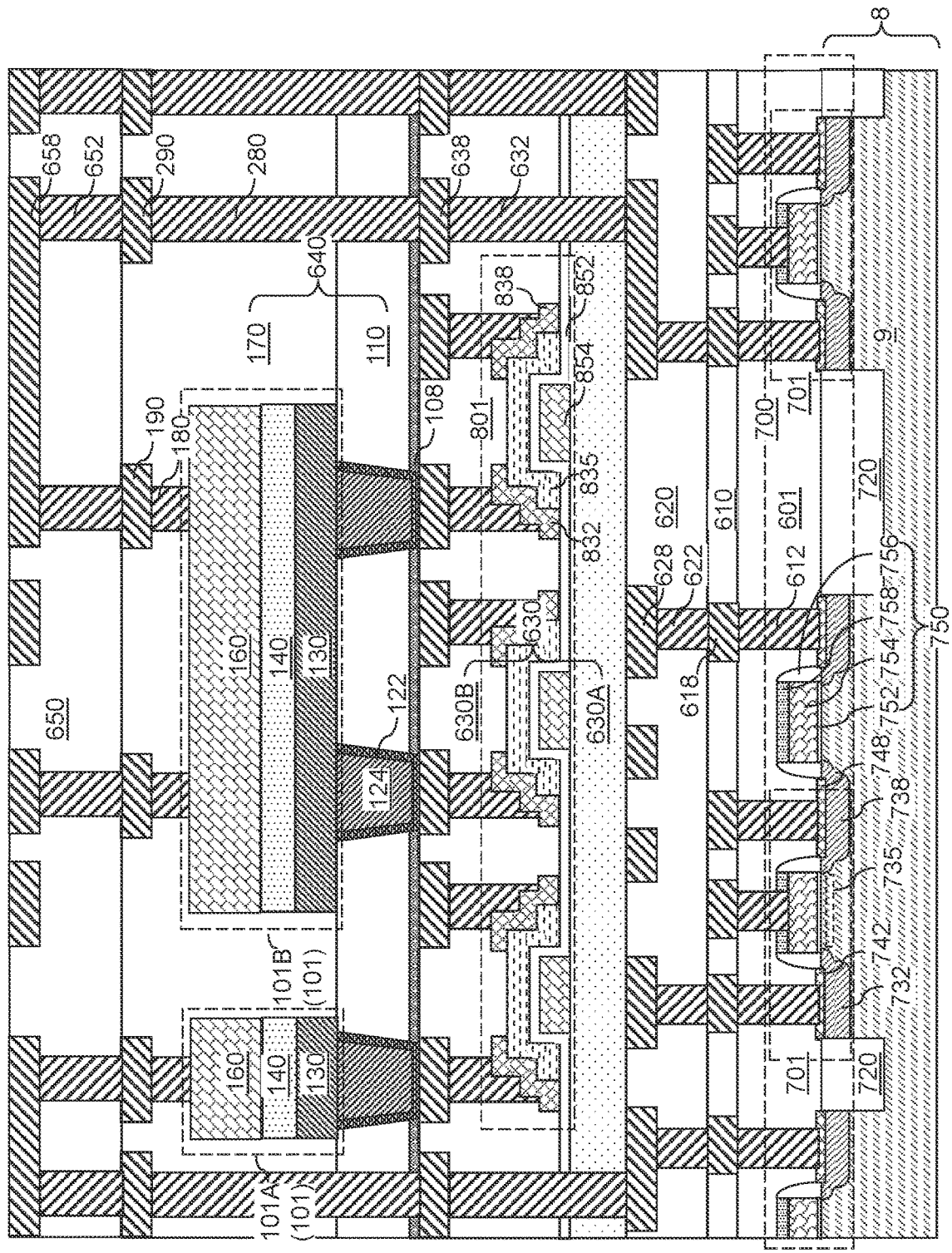
FIG. 16 is a vertical cross-sectional view of a sixth alternative configuration of the exemplary structure according to an embodiment of the present disclosure.

Referring to FIG. 16, a sixth alternative configuration of the exemplary structure according to an embodiment of the present disclosure may be derived from any of the configurations illustrated in FIGS. 10-15 by forming different types of ferroelectric memory cells 101 at a same level. For example, at least one first-type ferroelectric memory cell 101A and at least one second-type ferroelectric memory cell 101B may be formed by patterning a layer stack including a first electrode material layer 130L, a ferroelectric dielectric material layer 140L, and a second electrode material layer 160L at a processing step corresponding to the processing step of FIG. 9.

In an illustrative example, a first-type ferroelectric memory cell 101A may include a ferroelectric tunnel junction providing two tunneling resistance values depending on a polarization direction of a ferroelectric material within a ferroelectric dielectric material layer 140, and a first thin film transistor 801 and a first field effect transistor 701 may be configured to provide electrical current that tunnels through the ferroelectric tunnel junction. A second-type ferroelectric memory cell 101B may comprise a programmable ferroelectric capacitor providing two different capacitive states having two different capacitance values depending on a polarization direction of a ferroelectric material within a ferroelectric dielectric material layer 140, and a second thin film transistor 801 and a second field effect transistor 701 may be configured to provide a charging current for the programmable ferroelectric capacitor.

Figure 17:
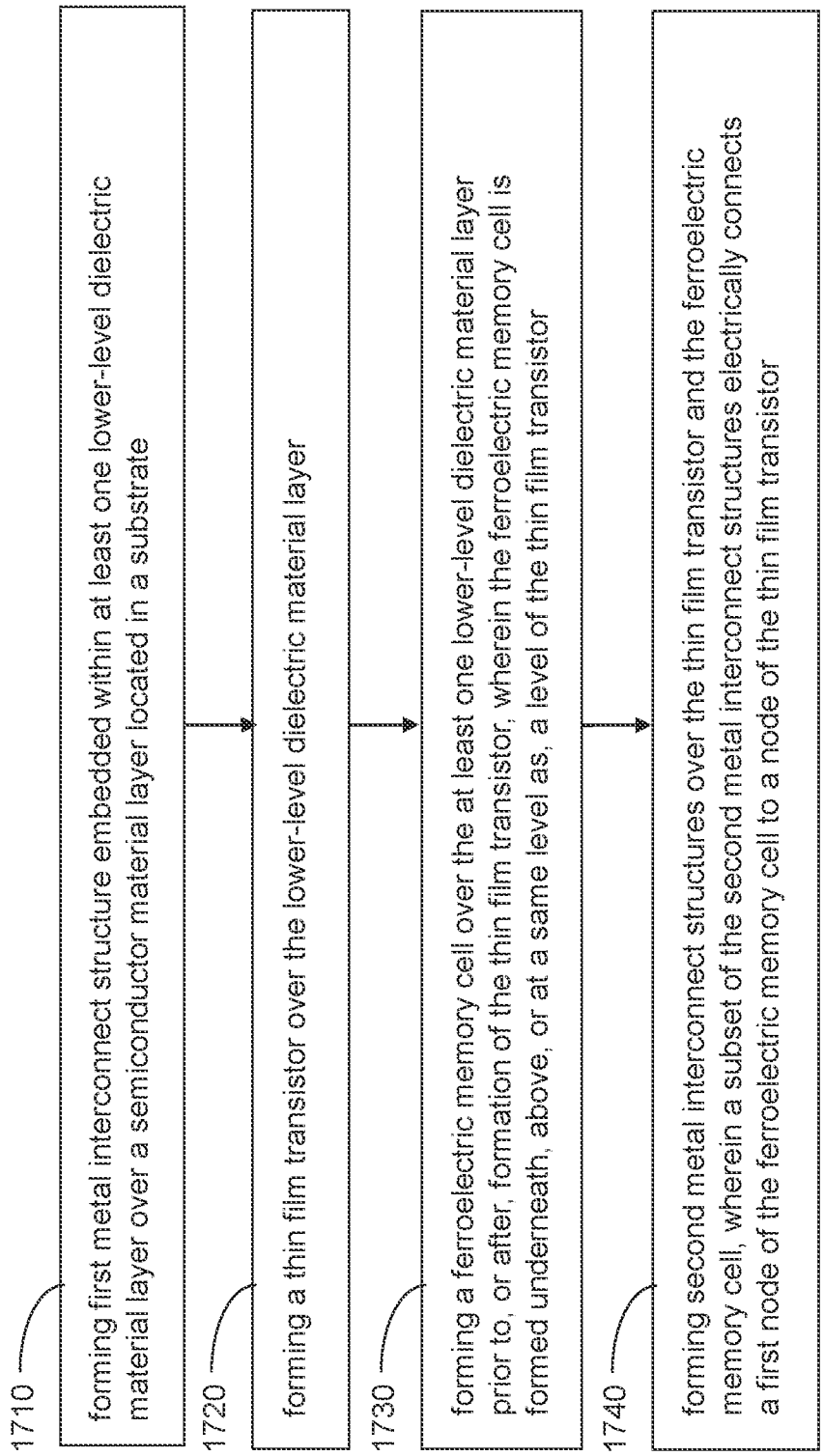
FIG. 17 is a flowchart that illustrates the general processing steps for manufacturing the semiconductor device of the present disclosure.

Referring to FIG. 17, a flowchart illustrates the general processing steps for manufacturing the semiconductor device of the various embodiments of the present disclosure. Referring to step 1710 and FIG. 1, first metal interconnect structures (612, 618, 622, 628) embedded within at least one lower-level dielectric material layer (601, 610, 620) may be formed over a substrate 8. Referring to step 1720 and FIGS. 2-5, a thin film transistor 801 may be formed over the lower-level dielectric material layer (601, 610, 620). Referring to step 1730 and FIGS. 6-9 and 11-16, a ferroelectric memory cell 101 may be formed over the at least one lower-level dielectric material layer (601, 610, 620) prior to, or after, formation of the thin film transistor 801, wherein the ferroelectric memory cell 101 is formed underneath, above, or at a same level as, a level of the thin film transistor 801. Referring to step 1740 and FIGS. 6-16, second metal interconnect structures (632, 638, 642, 648, 652, 658, 180, 190, 280, 290) may be formed over the thin film transistor 801 or the ferroelectric memory cell 101. A subset of the second metal interconnect structures (632, 638, 642, 648, 652, 658, 180, 190, 280, 290) electrically connects a first node of the ferroelectric memory cell 101 to a node of the thin film transistor 801.

Referring to all drawings and according to various embodiments of the present disclosure, a memory device is provided, which comprises: metal interconnect structures (612, 618, 622, 628, 632, 638, 642, 648, 642, 658, 180, 190, 280, 290) embedded within dielectric material layers (601, 610, 620, 630, 640, 650, 660) that overlie a top surface of a substrate 8; a thin film transistor 801 embedded in a first dielectric material layer (e.g., a third line-and-via-level dielectric material layer 630, a fourth line-and-via-level dielectric material layer 640, or a fifth line-and-via-level dielectric material layer 650) selected from the dielectric material layers, and is vertically spaced from the top surface of the substrate 8; and a ferroelectric memory cell 101 embedded within the dielectric material layers, wherein a first node (130 or 160) of the ferroelectric memory cell 101 is electrically connected to a node (835, 832, 838) of the thin film transistor 801 through a subset of the metal interconnect structures (632, 638, 642, 648, 642, 658, 180, 190, 280, 290) that is located above, and vertically spaced from, the top surface of the substrate 8.

In one embodiment, the memory device comprises a field effect transistor 701 including a semiconductor channel that contains a portion of the substrate 8, wherein a second node (160 or 130) of the ferroelectric memory cell 101 is electrically connected to a node of the field effect transistor 701. In one embodiment, the substrate 8 comprises a single crystalline semiconductor material; and the thin film transistor 801 comprises a polycrystalline semiconducting metal oxide material as a channel material.

In one embodiment, the ferroelectric memory cell 101 comprises a layer stack including a first electrode 130, a ferroelectric dielectric material layer 140, and a second electrode 160; one of the first electrode 130 and the second electrode 160 comprises the first node of the ferroelectric memory cell 101 that is electrically connected to the node of the thin film transistor 801; and another of the first electrode 130 and the second electrode 160 comprises the second node of the ferroelectric memory cell 101 that is electrically connected to the node of the field effect transistor 701.

In one embodiment, the memory device comprises a programming control circuit comprising a portion of a CMOS circuitry 700 that includes additional field effect transistors 701 configured to control gate voltages of the thin film transistor 801 and the field effect transistor 701. The CMOS circuitry 700 may be configured to provide: a first programming pulse that programs the ferroelectric dielectric material layer 140 into a first polarization state in which electrical polarization in the ferroelectric dielectric material layer points toward the first electrode 130; and a second programming pulse that programs the ferroelectric dielectric material layer into a second polarization state in which the electrical polarization in the ferroelectric dielectric material layer points toward the second electrode 160.

Generally, each ferroelectric memory cell 101 may have a built-in structural and electrical asymmetry between the first electrode 130 and the second electrode 160. The asymmetry may be provided, for example, by providing different materials between the first electrode 130 and the second electrode 160, and/or by inserting a suitable interfacial layer (such as a ferroelectric tunneling barrier layer including magnesium oxide). The asymmetry between the first electrode 130 and the second electrode 160 causes differences in the tunneling resistance or in the capacitance of the ferroelectric memory cell 101 between the two ferroelectric states of the ferroelectric memory cell 101, and may be sensed by a sensing circuit that may be provided within the CMOS circuitry 700. The sensing circuit may be configured to detect the tunneling current or the capacitance of a selected ferroelectric memory cell 101, which may be activated through selection of a field effect transistor 701 and a thin film transistor 801.

In one embodiment, the node of the thin film transistor 801 that is electrically connected to the first node or the second node of the ferroelectric memory cell 101 comprises a source region (and the source contact structure 832) or a drain region (and the drain contact structure 838) of the thin film transistor 801; and the node of the field effect transistor 701 comprises a source region 732 or a drain region 738 of the field effect transistor 701.

In one embodiment, the ferroelectric memory cell 101 comprises a ferroelectric tunnel junction providing two tunneling resistance values depending on a polarization direction of a ferroelectric material within a ferroelectric dielectric material layer 140; and the thin film transistor 801 and the field effect transistor 701 are configured to provide electrical current that tunnels through the ferroelectric tunnel junction.

In one embodiment, the ferroelectric memory cell 101 comprises a programmable ferroelectric capacitor providing two different capacitive states having two different capacitance values depending on a polarization direction of a ferroelectric material within a ferroelectric dielectric material layer 140; and the thin film transistor 801 and the field effect transistor 701 are configured to provide a charging current for the programmable ferroelectric capacitor.

In one embodiment, the ferroelectric memory cell 101 is embedded within a second dielectric material layer (e.g., a third line-and-via-level dielectric material layer 630, a fourth line-and-via-level dielectric material layer 640, or a fifth line-and-via-level dielectric material layer 650) selected from dielectric material layers that are located above, or below, the first dielectric material layer; and the subset of the metal interconnect structures (632, 638, 642, 648, 642, 658, 180, 190, 280, 290) extends between the first dielectric material layer and the second dielectric material layer.

In one embodiment, the ferroelectric memory cell 101 is located at a same level as the thin film transistor 801 and laterally surrounded by the first dielectric material layer; and the subset of the metal interconnect structures (180, 190, 280, 290) is embedded within the first dielectric material layer as illustrated in FIG. 14.

According to another aspect of the present disclosure, a memory device is provided, which comprises: metal interconnect structures (612, 618, 622, 628, 632, 638, 642, 648, 642, 658, 180, 190, 280, 290) embedded within dielectric material layers that overlie a substrate 8; an array of thin film transistors 801 embedded within a first dielectric material layer selected from dielectric material layers (601, 610, 620, 630, 640, 650, 660); and an array of ferroelectric memory cells 101 embedded within a second dielectric material layer selected from the dielectric material layers (601, 610, 620, 630, 640, 650, 660), the second dielectric material layer being the same or different from the first dielectric material layer, wherein each ferroelectric memory cell 101 within the array of ferroelectric memory cells 101 comprises a pillar structure containing a layer stack that includes a first electrode 130, a ferroelectric dielectric material layer 140 contacting a top surface of the first electrode 130, and a second electrode 160 contacting a top surface of the ferroelectric dielectric material layer 140; and wherein each ferroelectric memory cell 101 comprise a first node that is electrically connected to a node of a respective thin film transistor 801 which functions as an access transistor through a respective subset of the metal interconnect structures (632, 638, 642, 648, 642, 658, 180, 190, 280, 290).

In one embodiment, the memory device comprises at least one field effect transistor 701 including a semiconductor channel that contains a portion of the substrate 8 (such as a portion of the semiconductor material layer 9), wherein a node of the field effect transistor 701 is electrically connected to a second node of at least one ferroelectric memory cell 101 within the array of ferroelectric memory cells 101 through an additional subset of the metal interconnect structures (612, 618, 622, 628, 632, 638, 642, 648, 642, 658, 180, 190, 280, 290).

In one embodiment, each field effect transistor 701 within the at least one field effect transistor 701 is electrically connected to second nodes of a respective plurality of ferroelectric memory cells 101 selected from the array of ferroelectric memory cells 101 (which may be a row of ferroelectric memory cells 101 or a column of ferroelectric memory cells 101).

In one embodiment, each ferroelectric memory cell 101 within the array of ferroelectric memory cells 101 comprises a ferroelectric tunnel junction providing two tunneling resistance values depending on a polarization direction of a ferroelectric material within a ferroelectric dielectric material layer 140; and the array of thin film transistors 801 and the at least one field effect transistor 701 are configured to provide electrical current that tunnels through a selected ferroelectric tunnel junction within the array of ferroelectric memory cells 101.

In one embodiment, each ferroelectric memory cell 101 within the array of ferroelectric memory cells 101 comprises a programmable ferroelectric capacitor providing two different capacitive states having two different capacitance values depending on a polarization direction of a ferroelectric material within a ferroelectric dielectric material layer 140; and the array of thin film transistors 801 and the at least one field effect transistor 701 are configured to provide a charging current for a selected programmable ferroelectric capacitor within the array of ferroelectric memory cells 101.

The various embodiments of the present disclosure may be used to provide a ferroelectric memory device including at least one ferroelectric memory cell 101, such as a two-dimensional array of ferroelectric memory cells 101, that may be accessed through a combination of at least one thin film transistor 801 and at least one field effect transistor 701 located on a semiconductor material layer 9 in a substrate 8. By using a vertical stack of at least two levels of transistors (which may be three or more levels of transistors in embodiments in which two or more levels of thin film transistors 801 are used), the total device area occupied by the transistors in a plan view may be reduced, and a semiconductor chip with a higher ferroelectric device density may be provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   metal interconnect structures embedded within dielectric material layers that overlie a top surface of a substrate;
   a thin film transistor embedded in a first dielectric material layer selected from the dielectric material layers, and is vertically spaced from the top surface of the substrate; and
   a ferroelectric memory cell embedded within the dielectric material layers,
   wherein a first node of the ferroelectric memory cell is electrically connected to a node of the thin film transistor through a subset of the metal interconnect structures that is located above, and vertically spaced from, the top surface of the substrate, wherein the ferroelectric memory cell is located at a same level as the thin film transistor and is laterally surrounded by the first dielectric material layer.

2. The memory device of claim 1, further comprising a field effect transistor including a semiconductor channel that contains a portion of the substrate.

3. The memory device of claim 2, wherein:
   the substrate comprises a single crystalline semiconductor material; and the thin film transistor comprises a polycrystalline semiconducting metal oxide material as a channel material.

4. The memory device of claim 2, wherein a second node of the ferroelectric memory cell is electrically connected to a node of the field effect transistor.

5. The memory device of claim 4, wherein:
the ferroelectric memory cell comprises a layer stack including a first electrode, a ferroelectric dielectric material layer, and a second electrode;
one of the first electrode and the second electrode comprises the first node of the ferroelectric memory cell that is electrically connected to the node of the thin film transistor; and
another of the first electrode and the second electrode comprises the second node of the ferroelectric memory cell that is electrically connected to the node of the field effect transistor.

6. The memory device of claim 5, further comprising a programming control circuit configured to control gate voltages of the thin film transistor and the field effect transistor and configured to provide:
a first programming pulse that programs the ferroelectric dielectric material layer into a first polarization state in which electrical polarization in the ferroelectric dielectric material layer points toward the first electrode; and
a second programming pulse that programs the ferroelectric dielectric material layer into a second polarization state in which the electrical polarization in the ferroelectric dielectric material layer points toward the second electrode.

7. The memory device of claim 5, wherein:
the node of the thin film transistor comprises a source region or a drain region of the thin film transistor; and
the node of the field effect transistor comprises a source region or a drain region of the field effect transistor.

8. The memory device of claim 2, wherein:
the ferroelectric memory cell comprises a ferroelectric tunnel junction providing two tunneling resistance values depending on a polarization direction of a ferroelectric material within a ferroelectric dielectric material layer; and
the thin film transistor and the field effect transistor are configured to provide electrical current that tunnels through the ferroelectric tunnel junction.

9. The memory device of claim 2, wherein:
the ferroelectric memory cell comprises a programmable ferroelectric capacitor providing two different capacitive states having two different capacitance values depending on a polarization direction of a ferroelectric material within a ferroelectric dielectric material layer; and
the thin film transistor and the field effect transistor are configured to provide a charging current for the programmable ferroelectric capacitor.

10. The memory device of claim 1, wherein the subset of the metal interconnect structures is embedded within the first dielectric material layer.

11. A method of manufacturing a memory device, comprising:
forming first metal interconnect structures embedded within at least one lower-level dielectric material layer over a substrate;
forming a thin film transistor over the lower-level dielectric material layer;
forming a ferroelectric memory cell over the at least one lower-level dielectric material layer prior to, or after, formation of the thin film transistor, wherein the ferroelectric memory cell is formed underneath, above, or at a same level as, a level of the thin film transistor; and
forming second metal interconnect structures over the thin film transistor or the ferroelectric memory cell, wherein a subset of the second metal interconnect structures electrically connects a first node of the ferroelectric memory cell to a node of the thin film transistor,
wherein forming the ferroelectric memory cell comprises:
sequentially depositing a layer stack including a first electrode material layer, a ferroelectric dielectric material layer, and second electrode material layer over the substrate; and
patterning the layer stack into material portions comprising the ferromagnetic memory cell.

12. The method of claim 11, further comprising:
forming a patterned etch mask material portion over the second electrode material layer; and
anisotropically etching unmasked portions of the layer stack, wherein a remaining portion of the layer stack underlying the patterned etch mask material portion comprises the ferroelectric memory cell.

13. The method of claim 11, wherein forming the thin film transistor comprises:
forming a thin film transistor gate electrode over the at least one lower-level dielectric material layer;
forming a thin film transistor gate dielectric layer over the thin film transistor gate electrode;
depositing and patterning a semiconducting metal oxide material layer over the thin film transistor gate dielectric layer; and
forming a source contact structure and a drain contact structure on a patterned portion of the semiconducting metal oxide material layer.

14. The method of claim 11, wherein:
the ferroelectric memory cell comprises a vertical stack of a first electrode, a ferroelectric dielectric material layer, and a second electrode; and
the ferroelectric memory cell comprises one of:
a ferroelectric tunnel junction providing two tunneling resistance values depending on a polarization direction of a f erroelectric material within the ferroelectric dielectric material layer; and
a programmable ferroelectric capacitor providing two different capacitive states having two different capacitance values depending on a polarization direction of a ferro electric material within the ferroelectric dielectric material layer.

15. The method of claim 11, further comprising forming a field effect transistor including a semiconductor channel that contains a portion of the substrate, wherein a second node of the ferroelectric memory cell is electrically connected to a node of the field effect transistor through a subset of the first metal interconnect structures.

16. A method of manufacturing a memory device, comprising:
forming first metal interconnect structures embedded within at least one lower-level dielectric material layer over a substrate;
forming a thin film transistor over the lower-level dielectric material layer;
forming a ferroelectric memory cell over the at least one lower-level dielectric material layer prior to, or after, formation of the thin film transistor, wherein the ferroelectric memory cell is formed underneath, above, or at a same level as, a level of the thin film transistor; and
forming second metal interconnect structures over the thin film transistor or the ferroelectric memory cell, wherein a subset of the second metal interconnect structures electrically connects a first node of the ferroelectric memory cell to a node of the thin film transistor,
wherein forming the thin film transistor comprises:
forming a thin film transistor gate electrode over the at least one lower-level dielectric material layer;
forming a thin film transistor gate dielectric layer over the thin film transistor gate electrode; and
depositing and patterning a semiconducting metal oxide material layer over the thin film transistor gate dielectric layer.

17. The method of claim 16, wherein forming the thin film transistor further comprises forming a source contact structure and a drain contact structure on a patterned portion of the semiconducting metal oxide material layer.

18. The method of claim 16, wherein forming the ferroelectric memory cell comprises:
sequentially depositing a layer stack including a first electrode material layer, a ferroelectric dielectric material layer, and second electrode material layer over the ; and
forming a patterned etch mask material portion over the second electrode material layer; and
anisotropically etching unmasked portions of the layer stack, wherein a remaining portion of the layer stack underlying the patterned etch mask material portion comprises the ferroelectric memory cell.

19. The method of claim 16, wherein:
the ferroelectric memory cell comprises a vertical stack of a first electrode, a ferroelectric dielectric material layer, and a second electrode; and
the ferroelectric memory cell comprises one of:
a ferroelectric tunnel junction providing two tunneling resistance values depending on a polarization direction of a ferroelectric material within the ferroelectric dielectric material layer; and
a programmable ferroelectric capacitor providing two different capacitive states having two different capacitance values depending on a polarization direction of a ferroelectric material within the ferroelectric dielectric material layer.

20. The method of claim 16, further comprising forming a field effect transistor including a semiconductor channel that contains a portion of the substrate, wherein a second node of the ferroelectric memory cell is electrically connected to a node of the field effect transistor through a subset of the first metal interconnect structures.

* * * * *